(12) United States Patent
Wang et al.

(10) Patent No.: US 11,037,804 B2
(45) Date of Patent: Jun. 15, 2021

(54) METHODS AND APPARATUS FOR CLEANING SUBSTRATES

(71) Applicant: ACM Research (Shanghai) Inc., Shanghai (CN)

(72) Inventors: Hui Wang, Fremont, CA (US); Xi Wang, Shanghai (CN); Fuping Chen, Shanghai (CN); Fufa Chen, Cupertino, CA (US); Jian Wang, Shanghai (CN); Xiaoyan Zhang, Shanghai (CN); Yinuo Jin, Shanghai (CN); Zhaowei Jia, Shanghai (CN); Jun Wang, Shanghai (CN); Xuejun Li, Shanghai (CN)

(73) Assignee: ACM Research, Inc., Shanghai (CN)

( * ) Notice: Subject to any disclaimer, the term of this patent is extended or adjusted under 35 U.S.C. 154(b) by 95 days.

(21) Appl. No.: 16/334,923

(22) PCT Filed: Sep. 20, 2016

(86) PCT No.: PCT/CN2016/099428
§ 371 (c)(1),
(2) Date: Mar. 20, 2019

(87) PCT Pub. No.: WO2018/053678
PCT Pub. Date: Mar. 29, 2018

(65) Prior Publication Data
US 2019/0287824 A1    Sep. 19, 2019

(51) Int. Cl.
*H01L 21/67*    (2006.01)
*H01L 21/02*    (2006.01)
(Continued)

(52) U.S. Cl.
CPC .. *H01L 21/67051* (2013.01); *H01L 21/02068* (2013.01); *H01L 21/67057* (2013.01);
(Continued)

(58) Field of Classification Search
CPC combination set(s) only.
See application file for complete search history.

(56) References Cited

U.S. PATENT DOCUMENTS 7,247,977 B2    7/2007    Goodson
7,306,002 B2    12/2007   Kim et al.
(Continued)

FOREIGN PATENT DOCUMENTS

CN    101087007 A    12/2007
CN    101879511 A    11/2010
(Continued)

*Primary Examiner* — Erin F Bergner
(74) *Attorney, Agent, or Firm* — K&L Gates LLP

(57) ABSTRACT

The present invention discloses a method for cleaning substrate without damaging patterned structure on the substrate using ultra/mega sonic device, comprising: applying liquid into a space between a substrate and an ultra/mega sonic device; setting an ultra/mega sonic power supply at frequency $f_1$ and power $P_1$ to drive said ultra/mega sonic device; after micro jet generated by bubble implosion and before said micro jet generated by bubble implosion damaging patterned structure on the substrate, setting said ultra/mega sonic power supply at frequency $f_2$ and power $P_2$ to drive said ultra/mega sonic device; after temperature inside bubble cooling down to a set temperature, setting said ultra/mega sonic power supply at frequency $f_1$ and power $P_1$ again; repeating above steps till the substrate being cleaned.

33 Claims, 22 Drawing Sheets

(51) Int. Cl.
*H01L 21/68* (2006.01)
*H01L 21/687* (2006.01)

(52) U.S. Cl.
CPC ........ *H01L 21/67253* (2013.01); *H01L 21/68* (2013.01); *H01L 21/687* (2013.01)

(56) References Cited

U.S. PATENT DOCUMENTS

| | | |
|---|---|---|
| 7,495,371 B2 | 2/2009 | Goodson |
| 7,598,654 B2 | 10/2009 | Goodson |
| 8,310,131 B2 | 11/2012 | Goodson |
| 8,936,032 B2 | 1/2015 | Goodson |
| 9,159,311 B2 | 10/2015 | Goodson |
| 2001/0013355 A1 | 8/2001 | Busnaina |
| 2002/0195133 A1 | 12/2002 | Miranda et al. |
| 2011/0041871 A1 | 2/2011 | Fan |
| 2012/0097195 A1 | 4/2012 | Wang et al. |
| 2014/0216508 A1* | 8/2014 | Korbler .................. B08B 3/12 134/184 |

FOREIGN PATENT DOCUMENTS

| | | |
|---|---|---|
| CN | 103736690 A | 4/2014 |
| JP | H06-296942 | 10/1994 |
| JP | 2002-289565 | 10/2002 |
| JP | 2007-165695 | 6/2007 |
| JP | 2013-021160 | 1/2013 |

\* cited by examiner

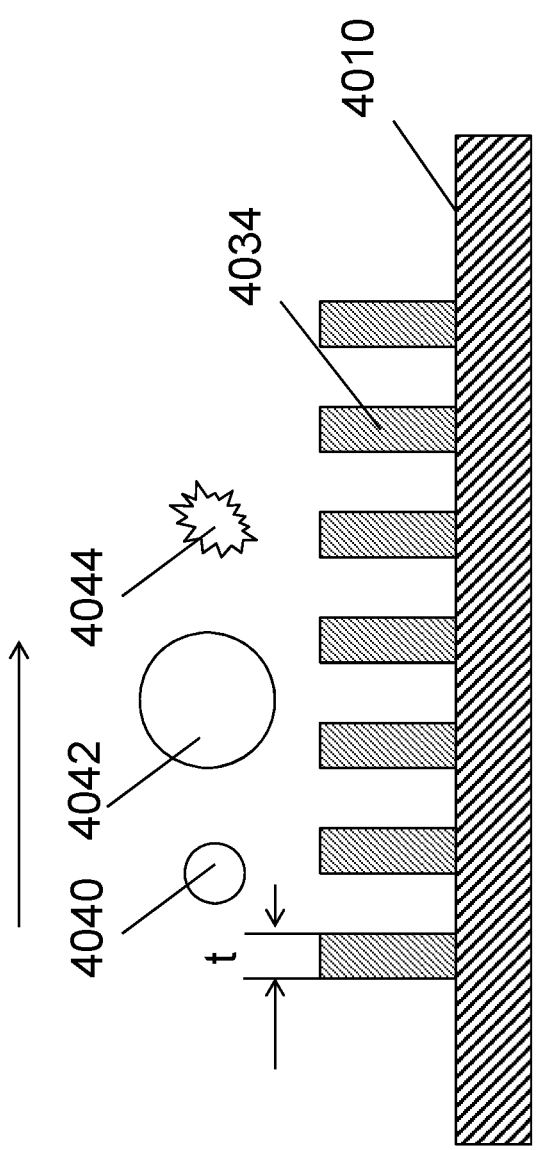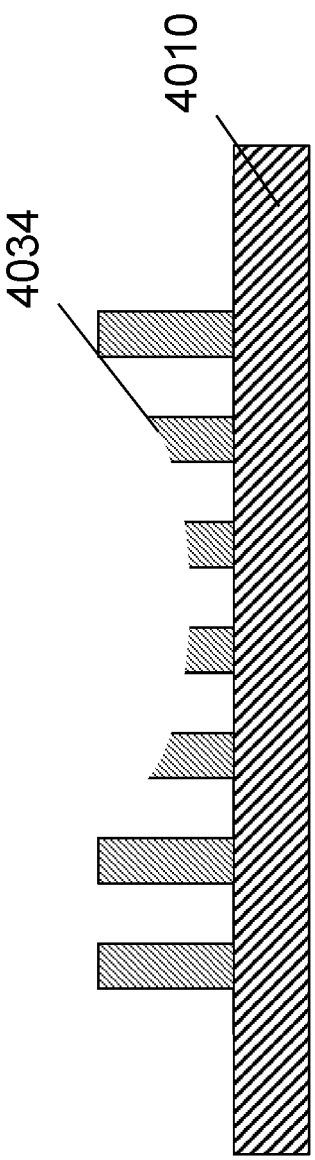

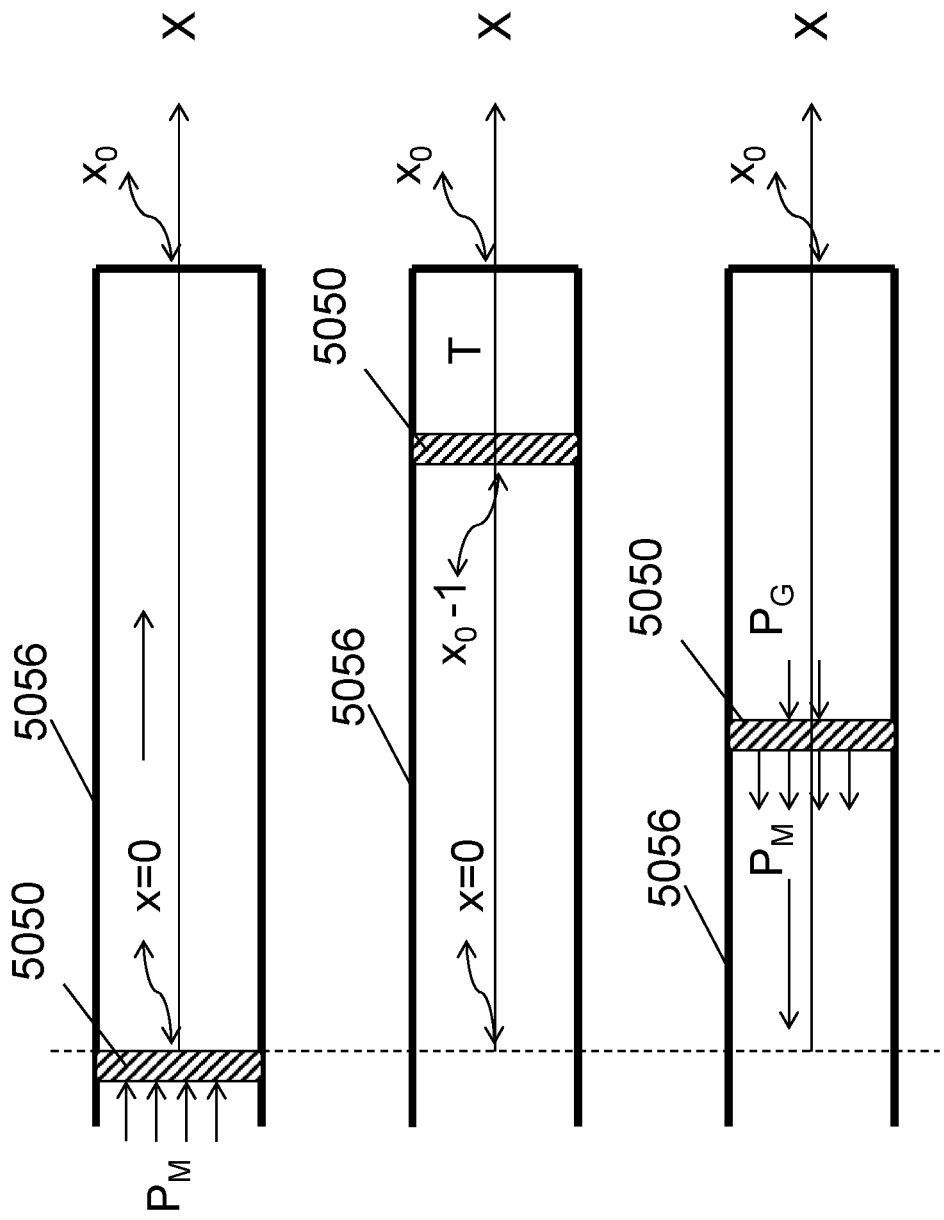

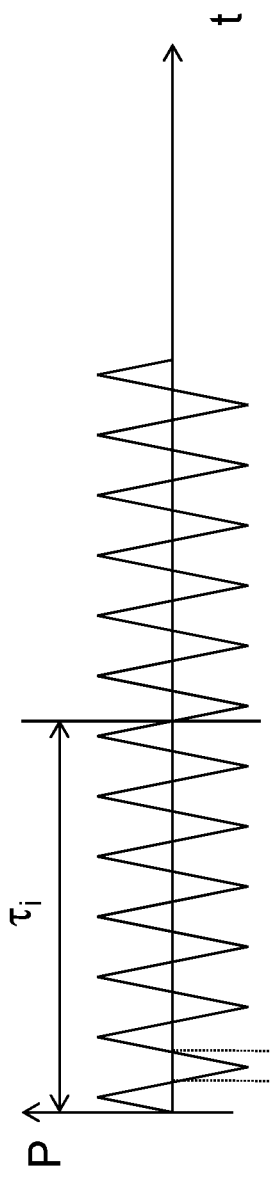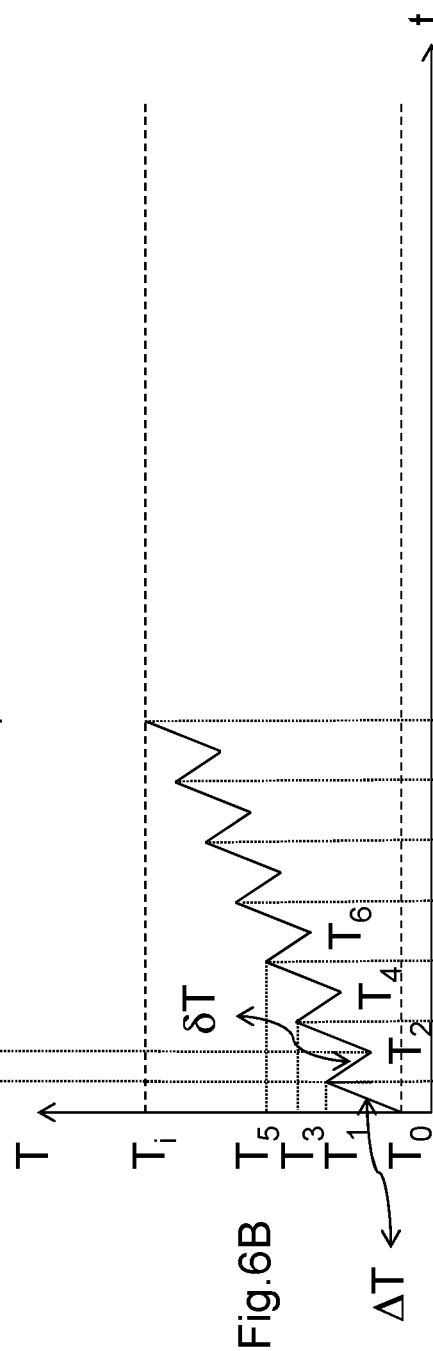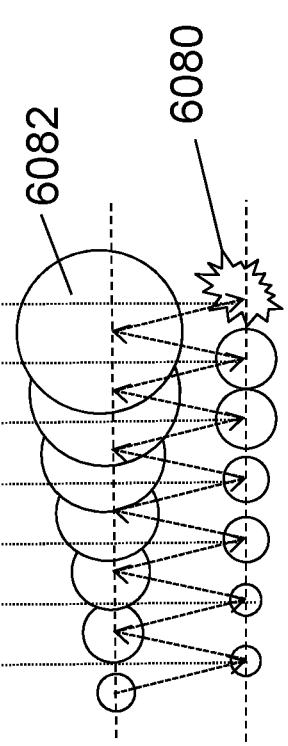

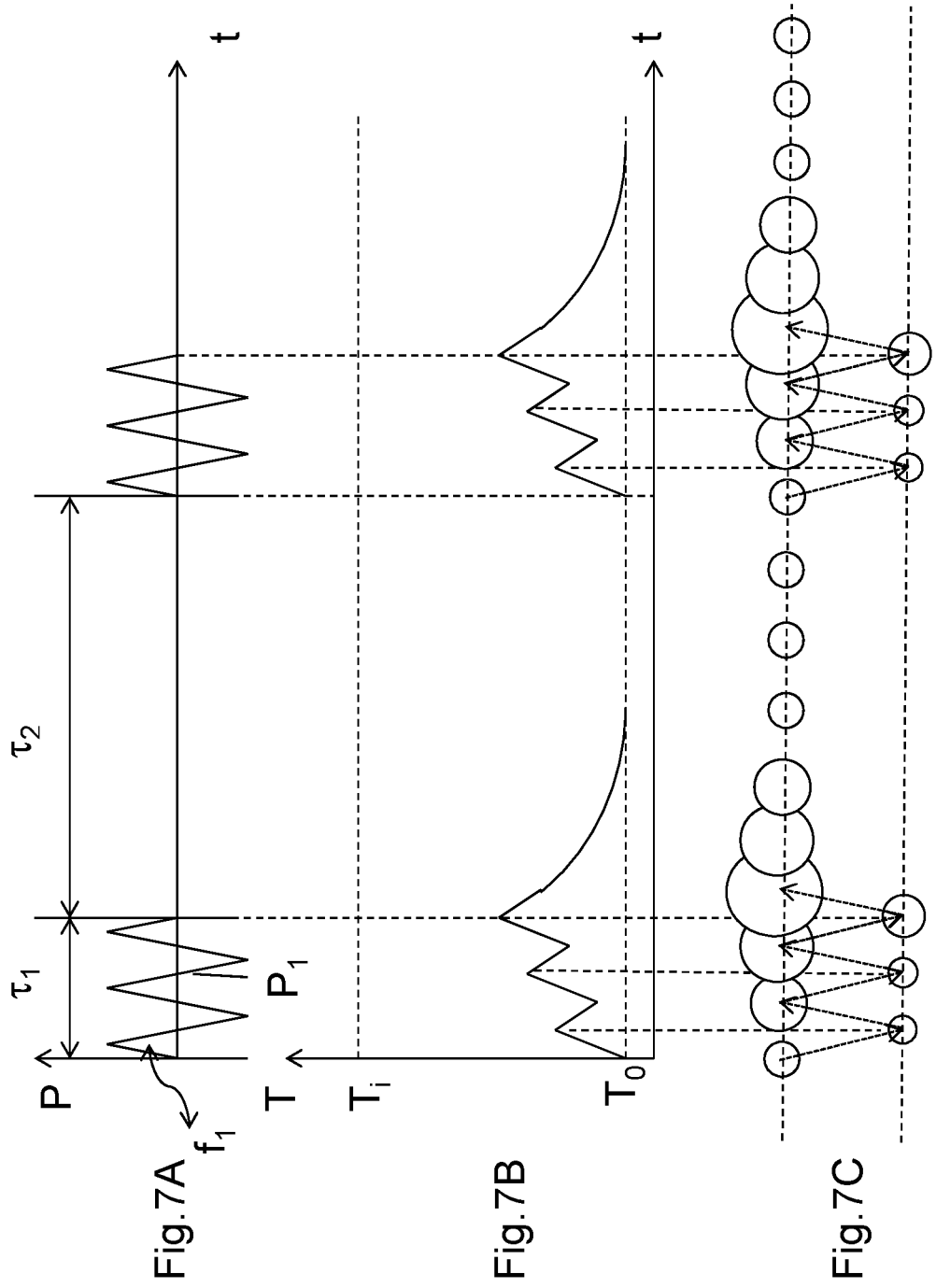

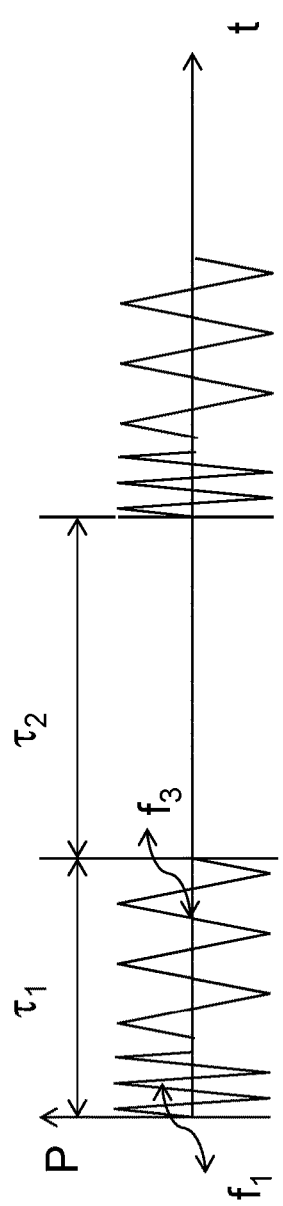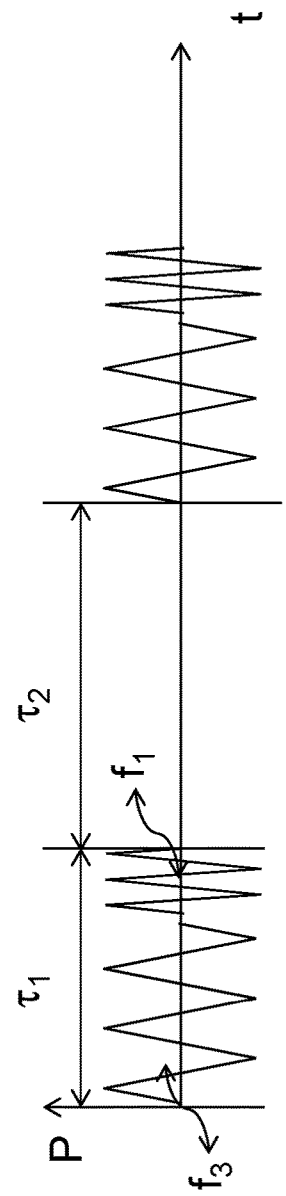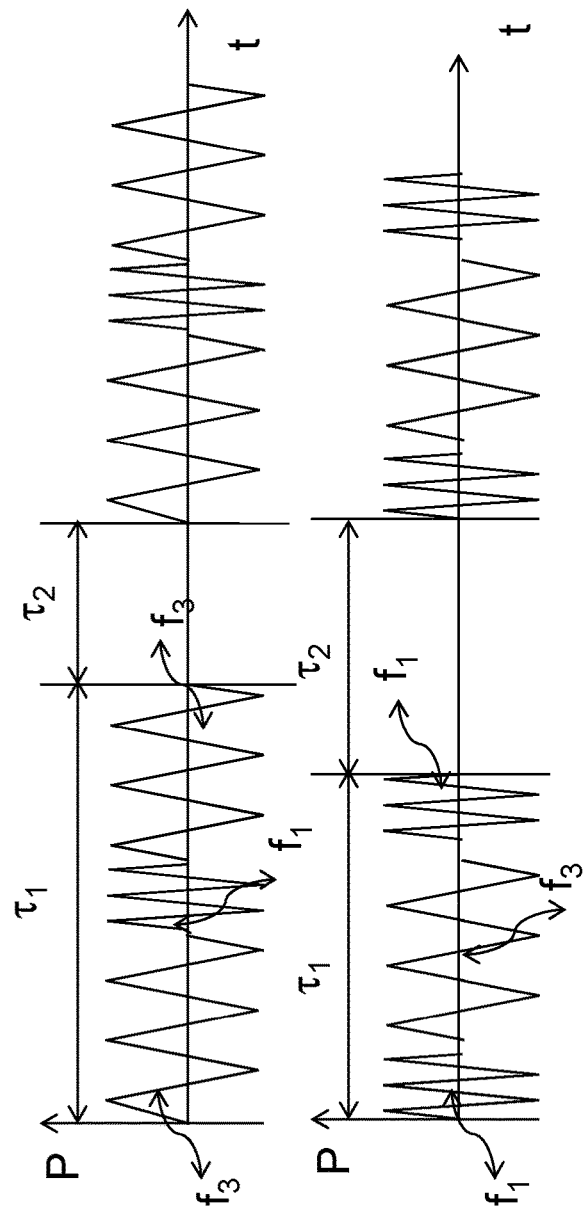

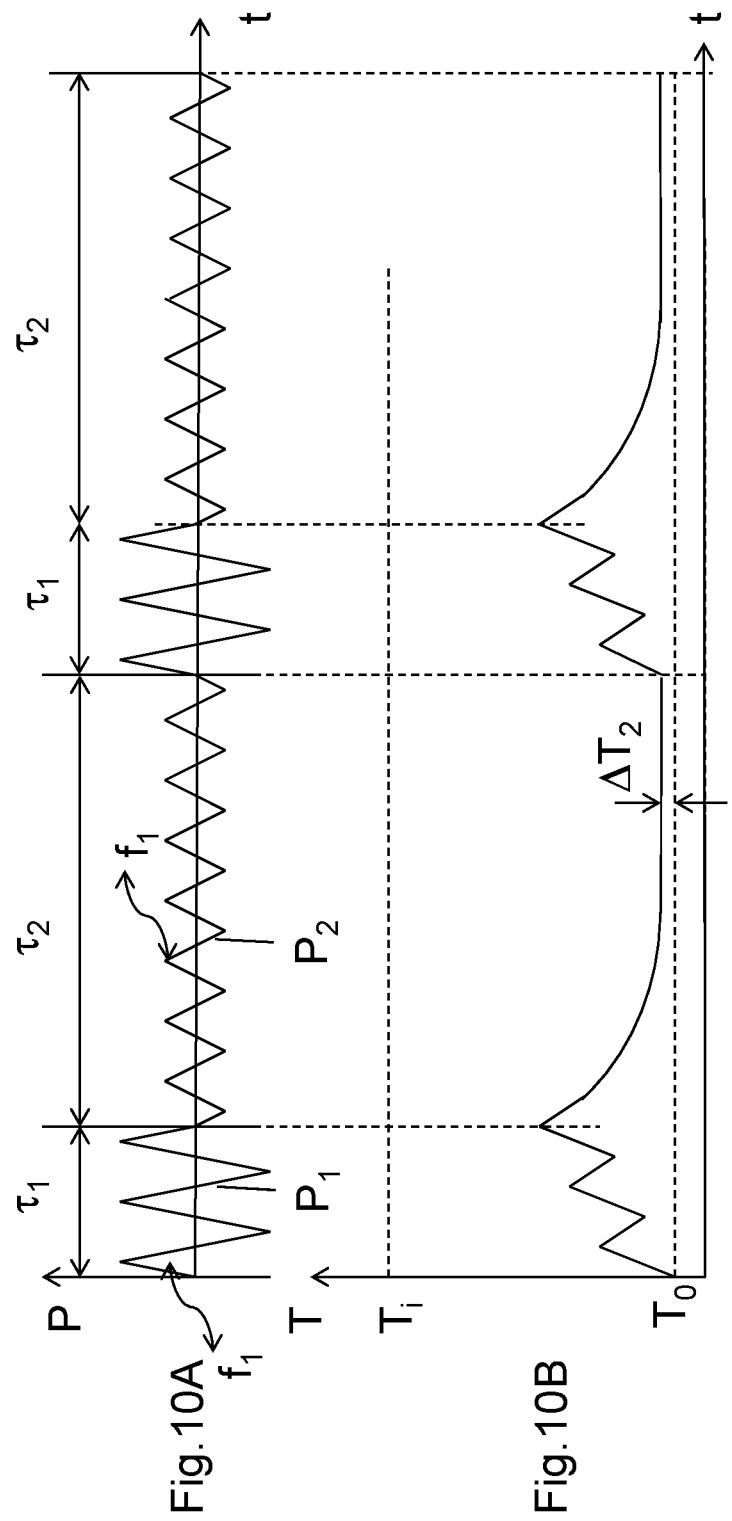

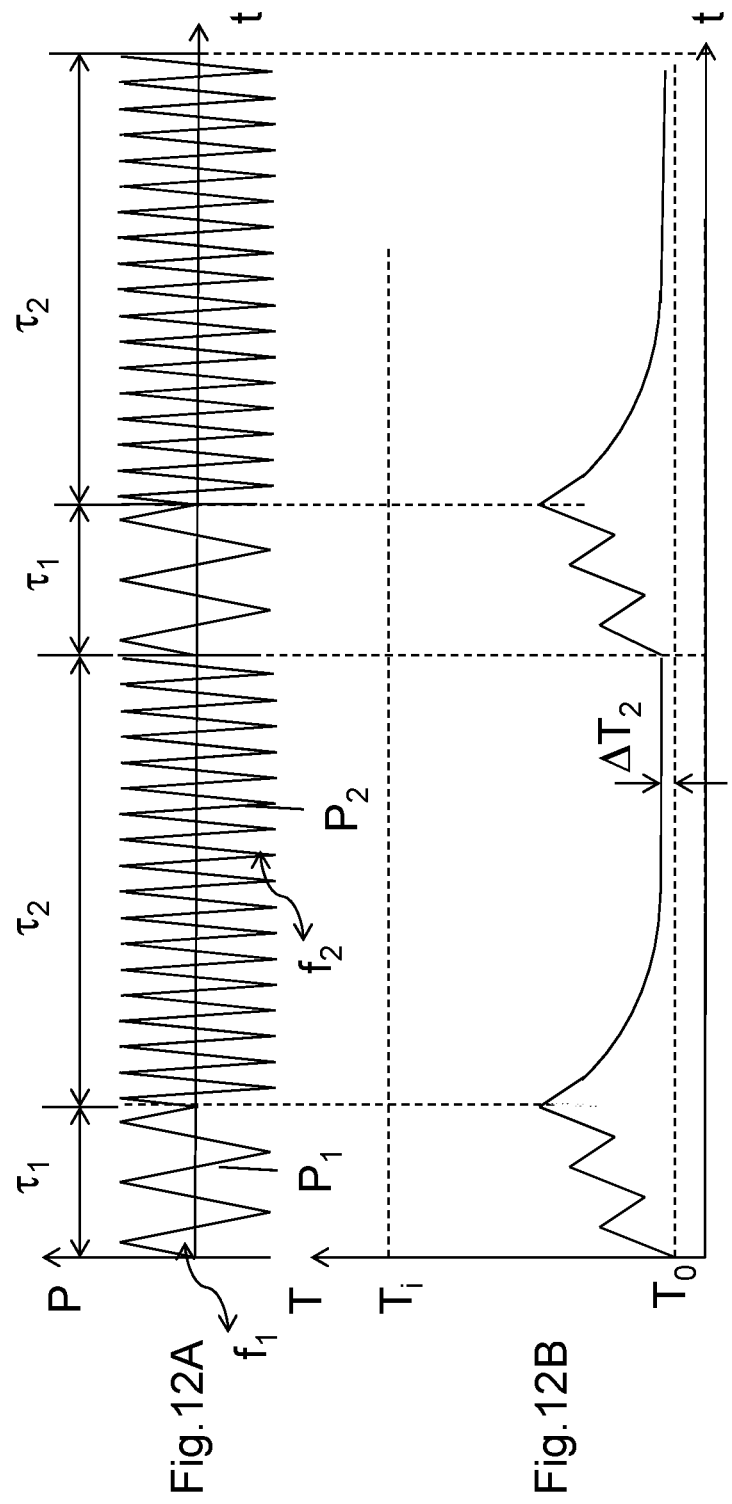

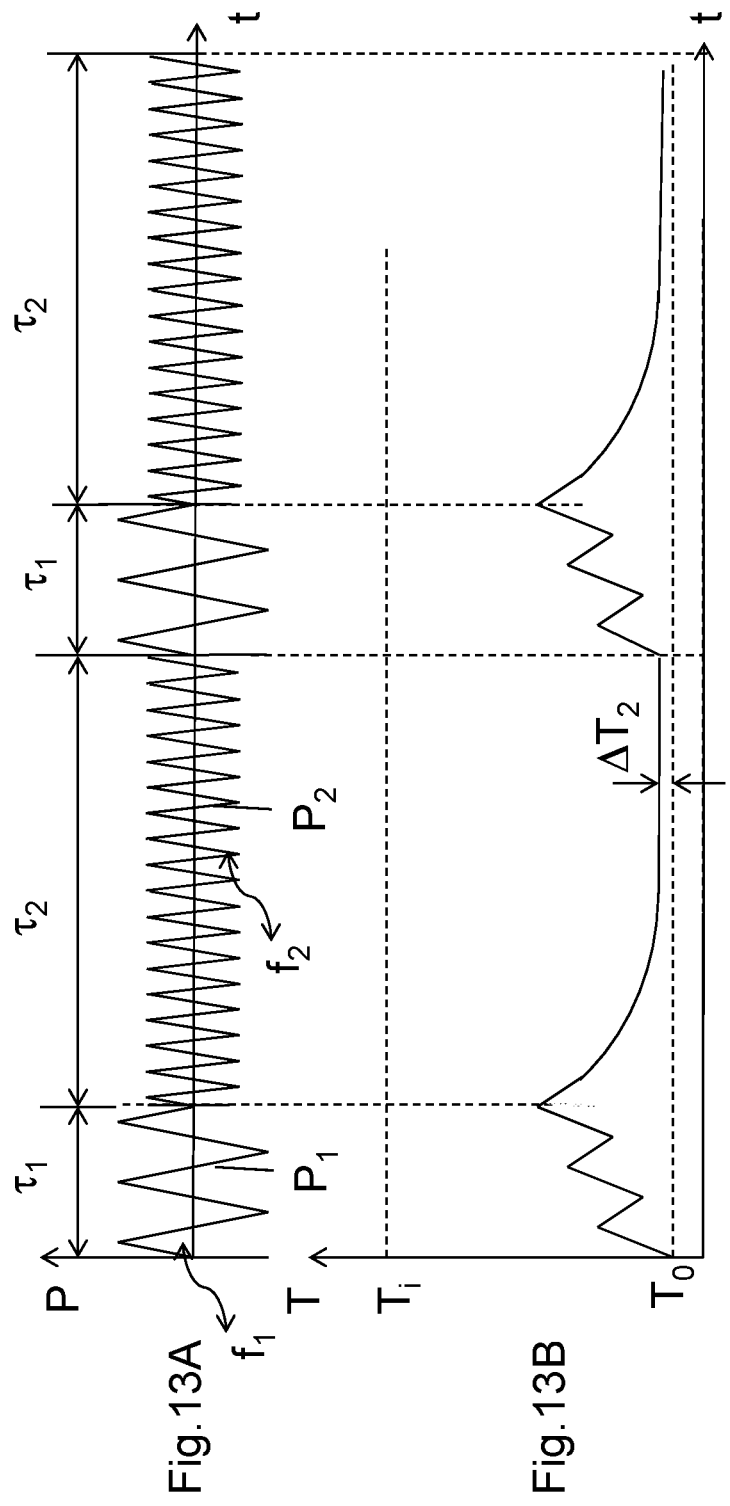

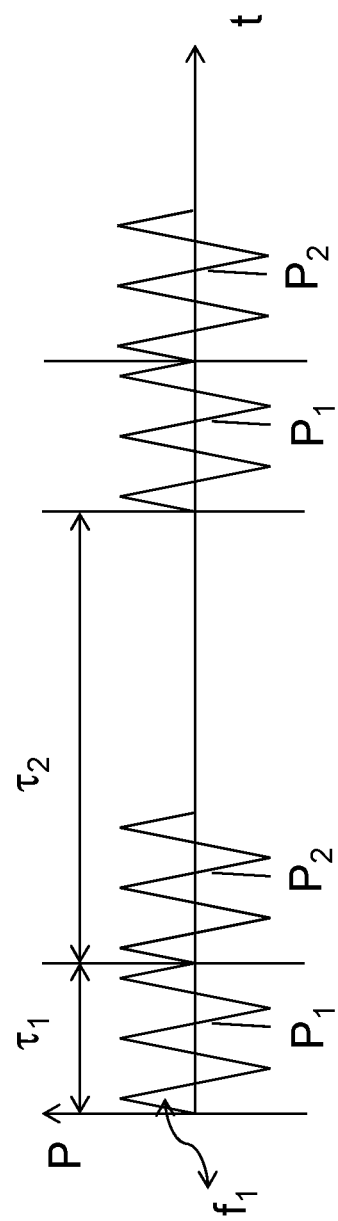

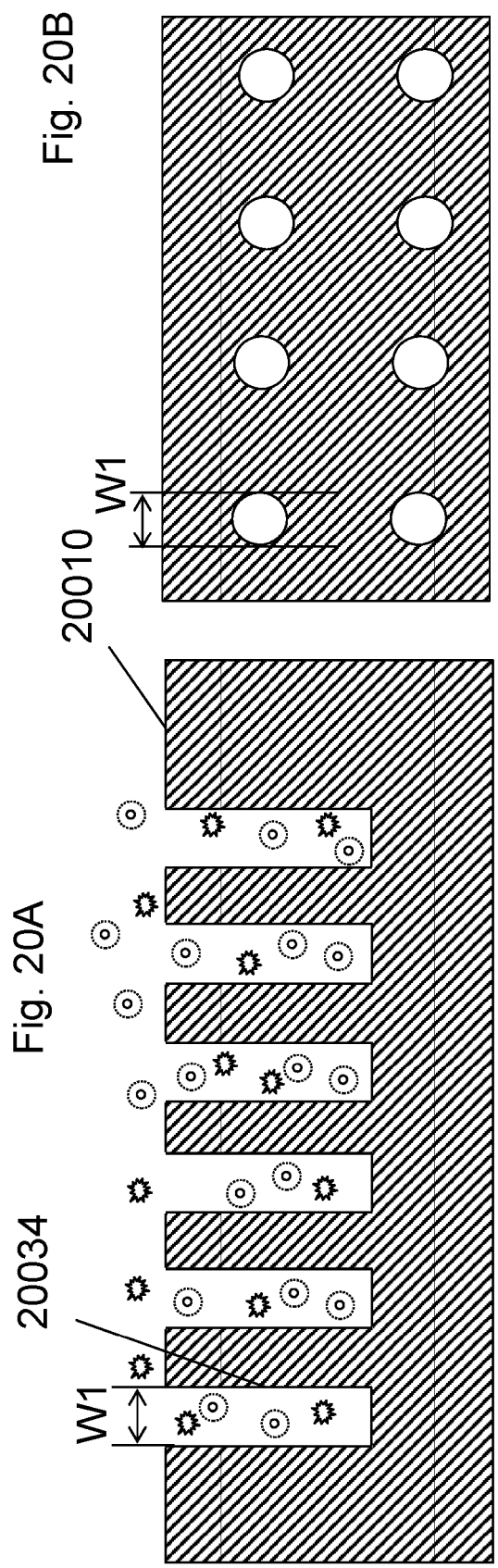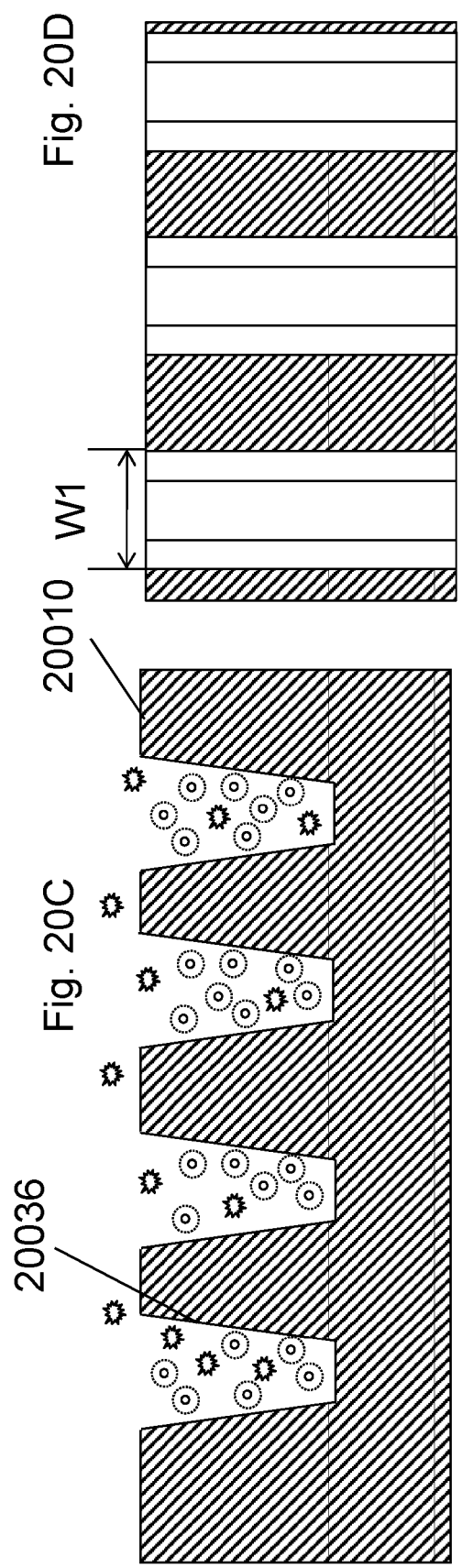

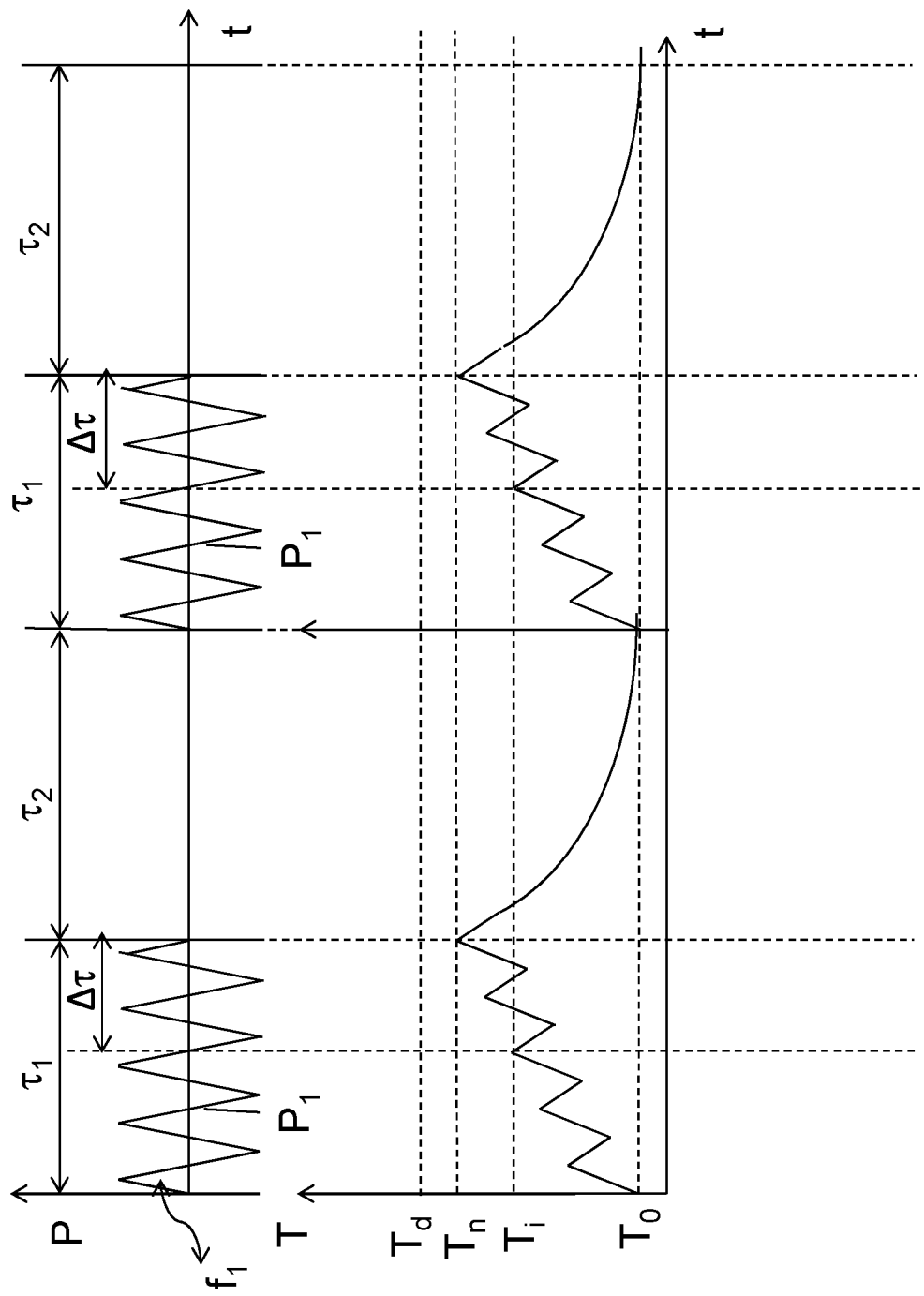

METHODS AND APPARATUS FOR CLEANING SUBSTRATES

CROSS-REFERENCE TO RELATED APPLICATIONS

This is a 371 national stage entry of and claims priority to International Application No. PCT/CN2016/099428, filed Sep. 20, 2019 and titled "METHODS AND APPARATUS FOR CLEANING SUBSTRATES," which is hereby incorporated by reference in its entirety.

FIELD OF THE INVENTION

The present invention generally relates to method and apparatus for cleaning substrate. More particularly, relates to controlling the bubble cavitation generated by ultra or mega sonic device during the cleaning process to achieve a stable or controlled cavitation on the entire substrate, which removes fine particles efficiently without damaging the device structure on the substrate.

BACKGROUND

Semiconductor devices are manufactured or fabricated on semiconductor wafers using a number of different processing steps to create transistor and interconnection elements. Recently, the transistors are built from two dimensions to three dimensions such as finFET transistors and 3D NAND memory. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the finFET transistors and interconnection elements on the semiconductor wafer may undergo, for example, masking, etching, and deposition processes to form the desired electronic circuitry of the semiconductor devices. In particular, multiple masking and plasma etching step can be performed to form a pattern of finFET, 3D NAND flash cell and or recessed areas in a dielectric layer on a semiconductor wafer that serve as fin for the transistor and or trenches and vias for the interconnection elements. In order to removal particles and contaminations in fin structure and or trench and via post etching or photo resist ashing, a wet cleaning step is necessary. Especially, when device manufacture node migrating to 14 or 16 nm and beyond, the side wall loss in fin and or trench and via is crucial for maintaining the critical dimension. In order to reduce or eliminate the side wall loss, it is important to use moderate, dilute chemicals, or sometime de-ionized water only. However, the dilute chemical or de-ionized water usually is not efficient to remove the particles in the fin structure, 3D NAND hole and or trench and via. Therefore the mechanical force such as ultra or mega sonic is needed in order to remove those particles efficiently. Ultra sonic or mega sonic wave will generate bubble cavitation which applies mechanical force to wafer structure, the violent cavitation such as transit cavitation or micro jet will damage those patterned structures. To maintain a stable or controlled cavitation is key parameters to control the mechanical force within the damage limit and at the same time efficiently to remove the particles. In the 3D NAND hole structure, the transit cavitation may not damage the hole structure, but however, the cavitation saturated inside hole will stop or reduce the cleaning effects.

Mega sonic energy coupled with nozzle to clean semi-conductor wafer is disclosed in U.S. Pat. No. 4,326,553. The fluid is pressurized and mega sonic energy is applied to the fluid by a mega sonic transducer. The nozzle is shaped to provide a ribbon-like jet of cleaning fluid vibrating at ultra/mega sonic frequencies for the impingement on the surface.

A source of energy vibrates an elongated probe which transmits the acoustic energy into the fluid is disclosed in U.S. Pat. No. 6,039,059. In one arrangement, fluid is sprayed onto both sides of a wafer while a probe is positioned close to an upper side. In another arrangement, a short probe is positioned with its end surface close to the surface, and the probe is moved over the surface as wafer rotates.

A source of energy vibrates a rod which rotates around it axis parallel to wafer surface is disclosed in U.S. Pat. No. 6,843,257 B2. The rod surface is etched to curve groves, such as spiral groove.

It is needed to have a better method for controlling the bubble cavitation generated by ultra or mega sonic device during the cleaning process to achieve a stable or controlled cavitation on the entire wafer, which removes fine particles efficiently without damaging the device structure on the wafer.

SUMMARY

One method of the present invention is to achieve a damage free ultra/mega-sonic cleaning on a wafer with patterned structure by maintaining a stable bubble cavitation. The stable bubble cavitation is controlled by setting a sonic power supply with power $P_1$ at a time interval shorter than $\tau_1$, and setting the sonic power supply with power $P_2$ at a time interval longer than $\tau_2$, and repeat above steps till the wafer is cleaned, where power $P_2$ is equal to zero or much smaller than power $P_1$, $\tau_1$ is a time interval that the temperature inside bubble raises to a critical implosion temperature; and $\tau_2$ is a time interval that the temperature inside bubble falls down to a temperature much lower than the critical implosion temperature.

Another method of the present invention is to achieve a damage free ultra/mega sonic cleaning on a wafer with patterned structure by maintaining a stable bubble cavitation. The stable bubble cavitation is controlled by setting a sonic power supply with frequency $f_1$ at a time interval shorter than $\tau_1$, and setting the sonic power supply with frequency $f_2$ at a time interval longer than $\tau_2$, and repeat above steps till the wafer is cleaned, where $f_2$ is much higher than $f_1$, better to be 2 times or 4 times higher, $\tau_1$ is a time interval that the temperature inside bubble raises to a critical implosion temperature; and $\tau_2$ is a time interval that the temperature inside bubble falls down to a temperature much lower than the critical implosion temperature.

Another method of the present invention is to achieve a damage free ultra/mega-sonic cleaning on a wafer with patterned structure by maintaining a stable bubble cavitation with bubble size less than space in patterned structure. The stable bubble cavitation with bubble size less than space in patterned structure is controlled by setting a sonic power supply at power $P_1$ for a time interval shorter than $\tau_1$, and setting the sonic power supply at power $P_2$ for a time interval longer than $\tau_2$, and repeat above steps till the wafer is cleaned, where $P_2$ is equal to zero or much smaller than $P_1$, $\tau_1$ is a time interval that the bubble size increases to a critical size equal to or larger than the space in patterned structures; and $\tau_2$ is a time interval that the bubble size decreases to a value much smaller than the space in patterned structure.

Another method of the present invention is to achieve a damage free ultra/mega-sonic cleaning on a wafer with patterned structure by maintaining a stable bubble cavitation with bubble size less than space in patterned structure. The stable bubble cavitation with bubble size less than space in patterned structure is controlled by setting a sonic power supply with frequency $f_1$ for a time interval shorter than $\tau_1$, and setting the sonic power supply with frequency $f_2$ for a time interval longer than $\tau_2$, and repeat above steps till the wafer is cleaned, where $f_2$ is much higher than $f_1$, better to be 2 times or 4 times higher, $\tau_1$ is a time interval that the bubble size increases to a critical size equal to or larger than the space in patterned structures; and $\tau_2$ is a time interval that the bubble size decreases to a value much smaller than the space in patterned structure.

A method of the present invention is to achieve a damage free ultra/mega-sonic cleaning on a wafer with patterned structure by maintaining a controlled transit cavitation. The controlled transit cavitation is controlled by setting a sonic power supply with power $P_1$ at a time interval shorter than $\tau_1$, and setting the sonic power supply with power $P_2$ at a time interval longer than $\tau_2$, and repeat above steps till the wafer is cleaned, where power $P_2$ is equal to zero or much smaller than power $P_1$, $\tau_1$ is a time interval that the temperature inside bubble raises higher than a critical implosion temperature; and $\tau_2$ is a time interval that the temperature inside bubble falls down to a temperature much lower than the critical implosion temperature. The controlled transit cavitation will provide the higher PRE (particle removal efficiency) with minimized damage to patterned structures.

Another method of the present invention is to achieve a damage free ultra/mega sonic cleaning on a wafer with patterned structure by maintaining controlled transit cavitation. The controlled transit cavitation is controlled by setting a sonic power supply with frequency $f_1$ at a time interval shorter than $\tau_1$, and setting the sonic power supply with frequency $f_2$ at a time interval longer than $\tau_2$, and repeat above steps till the wafer is cleaned, where $f_2$ is much higher than $f_1$, better to be 2 times or 4 times higher, $\tau_1$ is a time interval that the temperature inside bubble raises higher than a critical implosion temperature; and $\tau_2$ is a time interval that the temperature inside bubble falls down to a temperature much lower than the critical implosion temperature. The controlled transit cavitation will provide the higher PRE (particle removal efficiency) with minimized damage to patterned structures.

BRIEF DESCRIPTION OF THE DRAWINGS

FIGS. 4A-4B depict a transit cavitation damaging patterned structure on a wafer during cleaning process;

FIGS. 5A-5C depict thermal energy variation inside bubble during cleaning process;

FIGS. 6A-6C depict an exemplary wafer cleaning method;

FIGS. 7A-7C depict another exemplary wafer cleaning method;

FIGS. 9A-9D depict another exemplary wafer cleaning method;

FIGS. 10A-10B depict another exemplary wafer cleaning method;

FIGS. 12A-12B depict another exemplary wafer cleaning method;

FIGS. 13A-13B depict another exemplary wafer cleaning method;

FIG. 19 depicts another exemplary wafer cleaning method;

FIGS. 20A-20D depict bubble implosion occurs during the cleaning process without damage to patterned structures;

FIGS. 21A-21B depict another exemplary wafer cleaning method.

DETAILED DESCRIPTION

Figure 1A:
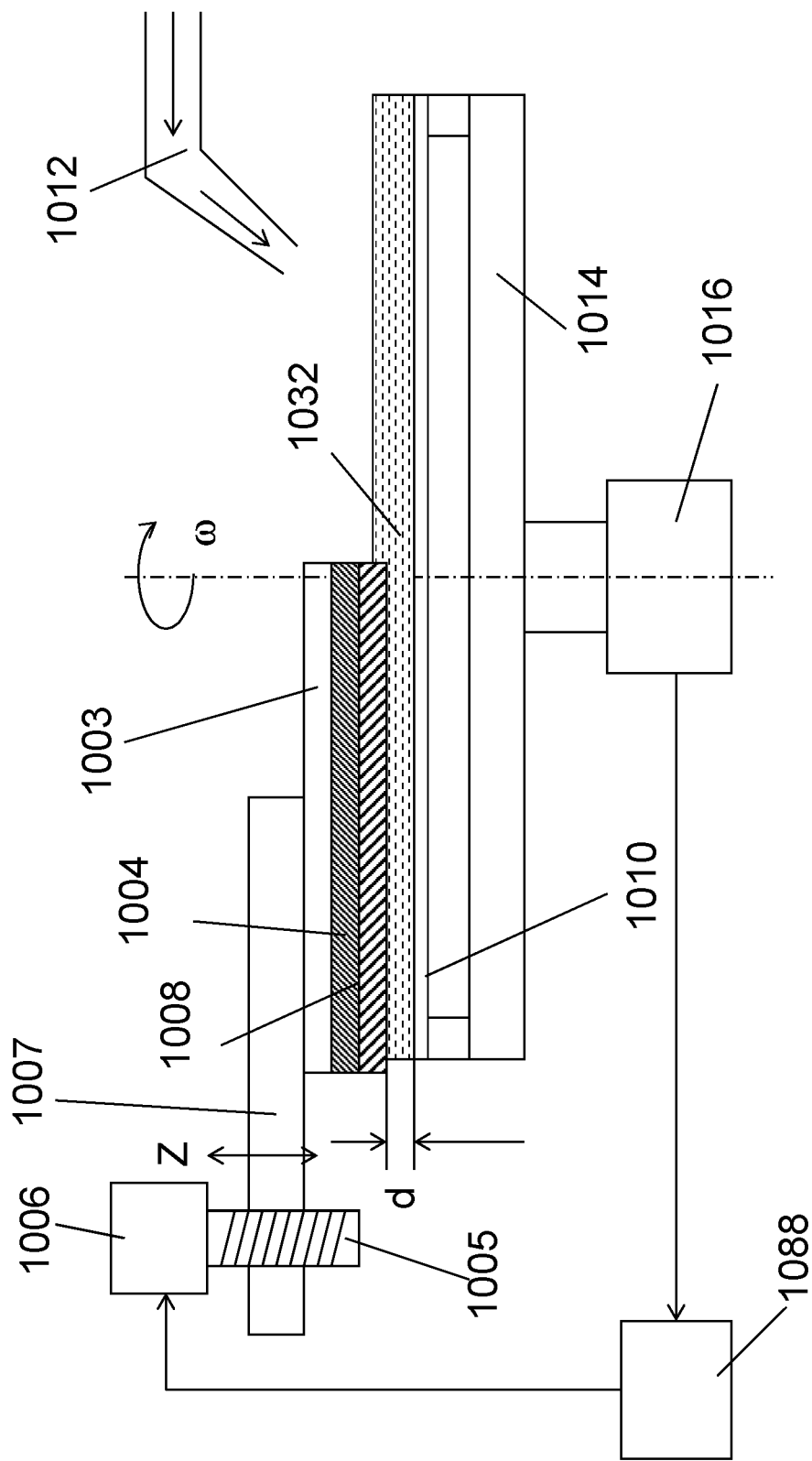
FIGS. 1A-1B depict an exemplary wafer cleaning apparatus using ultra/mega sonic device.
Figure 1B:
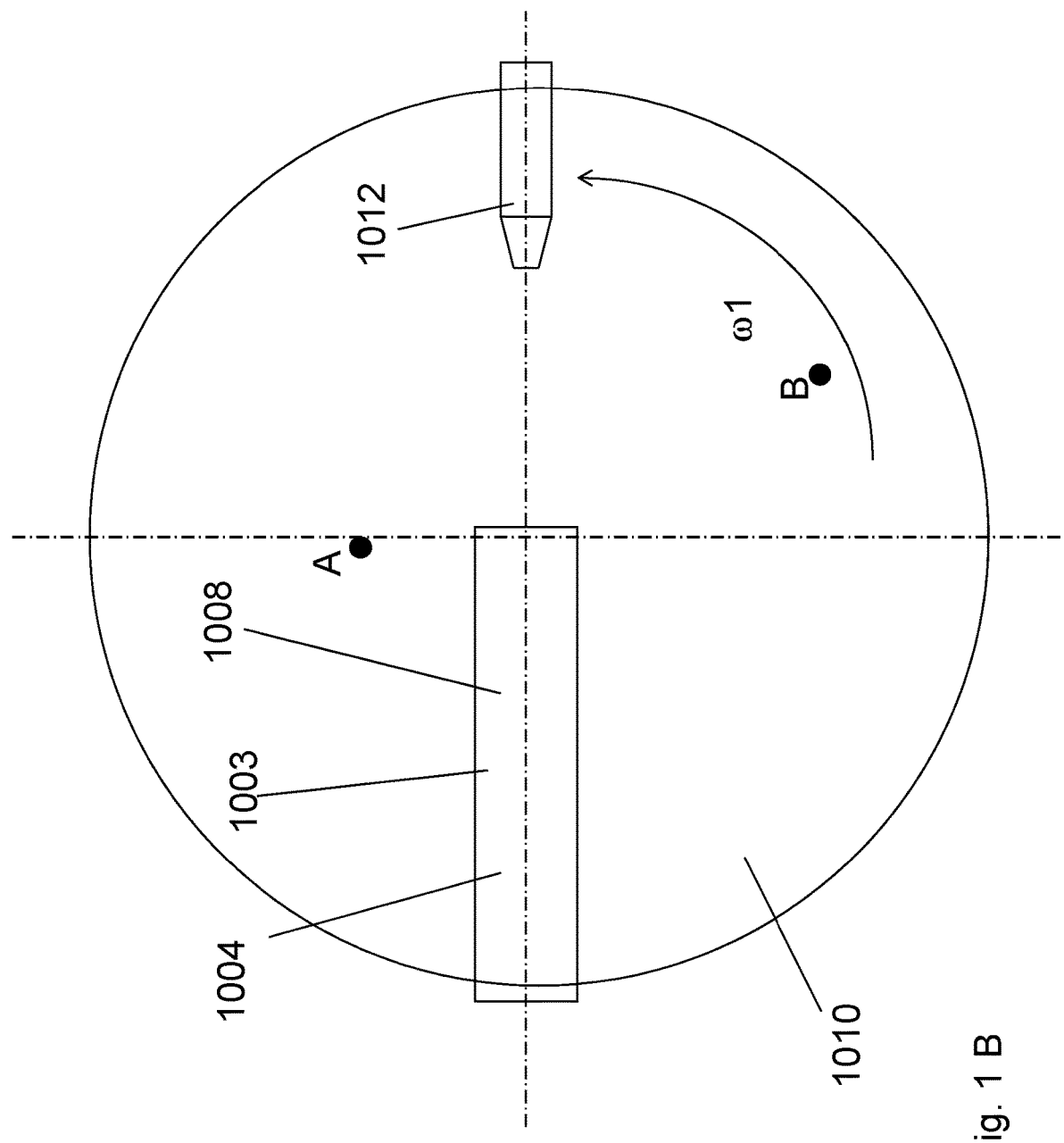

FIGS. 1A to 1B show a wafer cleaning apparatus using a ultra/mega sonic device. The wafer cleaning apparatus consists of wafer 1010, wafer chuck 1014 being rotated by rotation driving mechanism 1016, nozzle 1012 delivering cleaning chemicals or de-ionized water 1032, and ultra/mega sonic device 1003 and ultra/mega sonic power supply. The ultra/mega sonic device 1003 further consists of piezoelectric transducer 1004 acoustically coupled to resonator 1008. Transducer 1004 is electrically excited such that it vibrates and the resonator 1008 transmits high frequency sound energy into liquid. The bubble cavitation generated by the ultra/mega sonic energy oscillates particles on wafer 1010. Contaminants are thus vibrated away from the surfaces of the wafer 1010, and removed from the surfaces through the flowing liquid 1032 supplied by nozzle 1012.

Figure 2A:
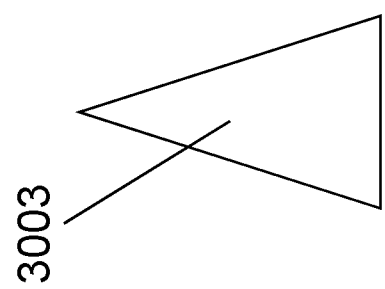
FIGS. 2A-2G depict variety of shape of ultra/mega sonic transducers.
Figure 2B:
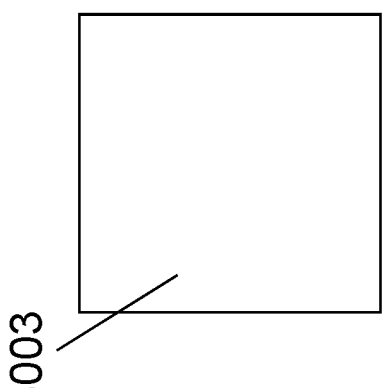
Figure 2C:
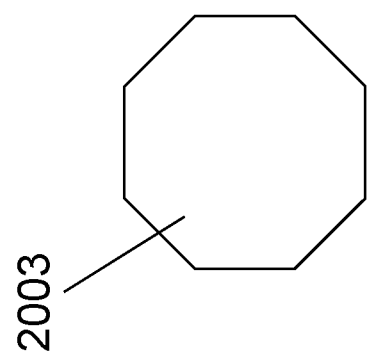
Figure 2D:
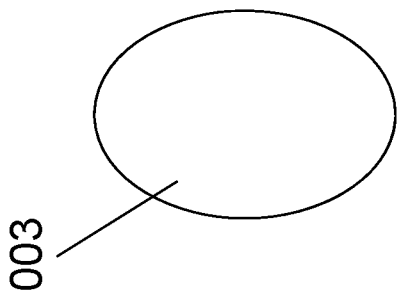
Figure 2E:
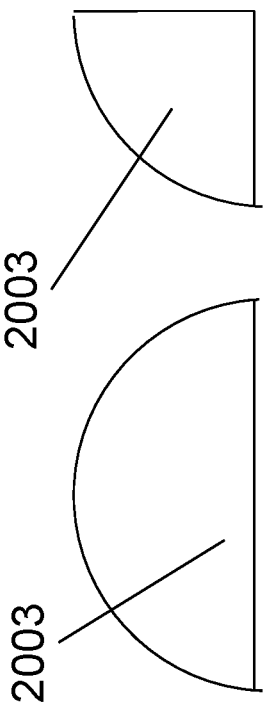
Figure 2F:
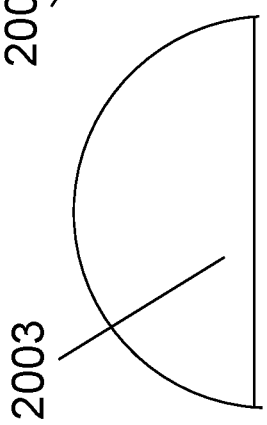
Figure 2G:
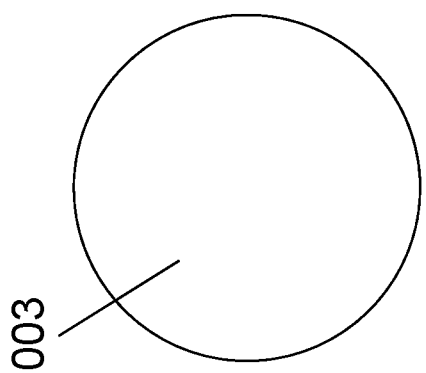

FIGS. 2A to 2G show top view of ultra/mega sonic devices according to the present invention. Ultra/mega sonic device 1003 shown in FIG. 1 can be replaced by different shape of ultra/mega sonic devices 3003, i.e. triangle or pie shape as shown in FIG. 2A, rectangle as shown in FIG. 2B, octagon as shown in FIG. 2C, elliptical as shown in FIG. 2D, half circle as shown in FIG. 2E, quarter circle as shown in FIG. 2F, and circle as shown in FIG. 2G.

Figure 3:
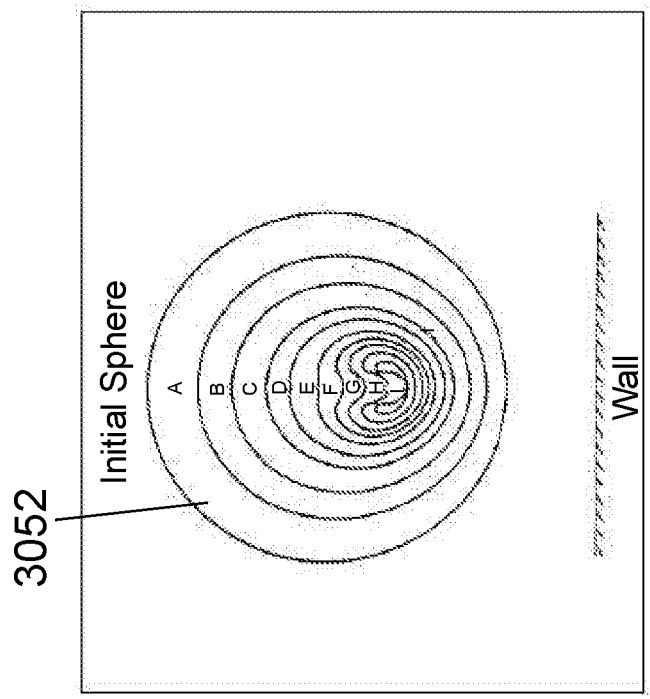
FIG. 3 depicts bubble cavitation during wafer cleaning process.

FIG. 3 shows a bubble cavitation during compression phase. The shape of bubbler is gradually compressed from a spherical shape A to an apple shape G, finally the bubble reaches to an implosion status I and forms a micro jet. As shown in FIGS. 4A and 4B, the micro jet is very violent (can reaches a few thousands atmospheric pressures and a few thousands ° C.), which can damage the fine patterned structure 4034 on the semiconductor wafer 4010, especially when the feature size t shrinks to 70 nm and smaller.

FIGS. 5A to 5C show simplified model of bubble cavitation according to the present invention. As sonic positive pressure acting on the bubble, the bubble reduces its volume. During this volume shrinking process, the sonic pressure $P_M$ did a work to the bubble, and the mechanical work converts to thermal energy inside the bubble, therefore temperature of gas and/or vapor inside bubble increases.

The idea gas equation can be expressed as follows:

$$p_0 v_0/T_0 = pv/T \qquad (1),$$

where, $p_0$ is pressure inside bubbler before compression, $v_0$ initial volume of bubble before compression, $T_0$ temperature of gas inside bubbler before compression, p is pressure inside bubbler in compression, v volume of bubble in compression, T temperature of gas inside bubbler in compression.

In order to simplify the calculation, assuming the temperature of gas is no change during the compression or compression is very slow and temperature increase is cancelled by liquid surrounding the bubble. So that the mechanical work $w_m$ did by sonic pressure $P_M$ during one time of bubbler compression (from volume N unit to volume 1 unit or compression ratio=N) can be expressed as follows:

$$w_m = \int_0^{x_0-1} pS dx = \int_0^{x_0-1} (S(x_0 p_0)/(x_0 - x)) dx = $$
$$Sx_0 p_0 \int_0^{x_0-1} dx/(x_0 - x) = -Sx_0 p_0 \ln(x_0 - x)\bigg|_0^{x_0-1} = Sx_0 p_0 \ln(x_0) \qquad (2)$$

Where, S is area of cross section of cylinder, $x_0$ the length of the cylinder, $p_0$ pressure of gas inside cylinder before compression. The equation (2) does not consider the factor of temperature increase during the compression, so that the actual pressure inside bubble will be higher due to temperature increase. Therefore the actual mechanical work conducted by sonic pressure will be larger than that calculated by equation (2).

If assuming all mechanical work did by sonic pressure is partially converted to thermal energy and partially converted mechanical energy of high pressure gas and vapor inside bubble, and such thermal energy is fully contributed to temperature increase of gas inside of bubbler (no energy transferred to liquid molecules surrounding the bubble), and assuming the mass of gas inside bubble staying constant before and after compression, then temperature increase ΔT after one time of compression of bubble can be expressed in the following formula:

$$\Delta T = Q/(mc) = \beta w_m/(mc) = \beta Sx_0 p_0 \ln(x_0)/(mc) \qquad (3)$$

where, Q is thermal energy converted from mechanical work, β ratio of thermal energy to total mechanical works did by sonic pressure, m mass of gas inside the bubble, c gas specific heat coefficient. Substituting β=0.65, S=1E-12 m², $x_0$=1000 μm=1E-3 m (compression ratio N=1000), $p_0$=1 kg/cm²=1E4 kg/m², m=8.9E-17 kg for hydrogen gas, c=9.9E3 J/(kg ° k) into equation (3), then ΔT=50.9° k. The temperature $T_1$ of gas inside bubbler after first time compression can be calculated as $$T_1 = T_0 + \Delta T = 20° C. + 50.9° C. = 70.9° C. \qquad (4)$$

When the bubble reaches the minimum size of 1 micron as shown in FIG. 5B. At such a high temperature, of cause some liquid molecules surrounding bubble will evaporate. After then, the sonic pressure become negative and bubble starts to increase its size. In this reverse process, the hot gas and vapor with pressure $P_G$ will do work to the surrounding liquid surface. At the same time, the sonic pressure $P_M$ is pulling bubble to expansion direction as shown in FIG. 5C, therefore the negative sonic pressure $P_M$ also do partial work to the surrounding liquid too. As the results of the joint efforts, the thermal energy inside bubble cannot be fully released or converted to mechanical energy, therefore the temperature of gas inside bubble cannot cool down to original gas temperature $T_0$ or the liquid temperature. After the first cycle of cavitation finishes, the temperature $T_2$ of gas in bubble will be somewhere between $T_0$ and $T_1$ as shown in FIG. 6B. Or $T_2$ can be expressed as $$T_2 = T_1 - \delta T = T_0 + \Delta T - \delta T \qquad (5)$$

Where δT is temperature decrease after one time of expansion of the bubble, and δT is smaller than ΔT.

When the second cycle of bubble cavitation reaches the minimum bubble size, the temperature T3 of gas and or vapor inside bubbler will be $$T_3 = T_2 + \Delta T = T_0 + \Delta T - \delta T + \Delta T = T_0 + 2\Delta T - \delta T \qquad (6)$$

When the second cycle of bubble cavitation finishes, the temperature T4 of gas and/or vapor inside bubbler will be $$T_4 = T_3 - \delta T = T_0 + 2\Delta T - \delta T - \delta T = T_0 + 2\Delta T - 2\delta T \qquad (7)$$

Similarly, when the nth cycle of bubble cavitation reaches the minimum bubble size, the temperature $T_{2n-1}$ of gas and or vapor inside bubbler will be $$T_{2n-1} = T_0 + n\Delta T - (n-1)\delta T \qquad (8)$$

When the nth cycle of bubble cavitation finishes, the temperature $T_{2n}$ of gas and/or vapor inside bubbler will be $$T_{2n} = T_0 + n\Delta T - n\delta T = T_0 + n(\Delta T - \delta T) \qquad (9)$$

As cycle number n of bubble cavitation increase, the temperature of gas and vapor will increase, therefore more molecules on bubble surface will evaporate into inside of bubble 6082 and size of bubble 6082 will increase too, as shown in FIG. 6C. Finally the temperature inside bubble during compression will reach implosion temperature $T_i$ (normally $T_i$ is as high as a few thousands ° C.), and violent micro jet 6080 forms as shown in FIG. 6C.

From equation (8), implosion cycle number $n_i$ can be written as following:

$$n_i = (T_i - T_0 - \Delta T)/(\Delta T - \delta T) + 1 \qquad (10)$$

From equation (10), implosion time $\tau_i$ can be written as following:

$$\tau_i = n_i t_1 = t_1((T_i - T_0 - \Delta T)/(\Delta T - \delta T) + 1) \qquad (11)$$
$$= n_i/f_1 = ((T_i - T_0 - \Delta T)/(\Delta T - \delta T) + 1)/f_1$$

Where, $t_1$ is cycle period, and $f_1$ frequency of ultra/mega sonic wave.

According to formulas (10) and (11), implosion cycle number $n_i$ and implosion time $\tau_1$ can be calculated. Table 1 shows calculated relationships among implosion cycle number $n_i$, implosion time $\tau_i$ and (ΔT−δT), assuming Ti=3000° C., ΔT=50.9° C., $T_0$=20° C., $f_1$=500 KHz, $f_1$=1 MHz, and $f_1$=2 MHz.

TABLE 1

| ΔT − δT (° C.) | 0.1 | 1 | 10 | 30 | 50 |
|---|---|---|---|---|---|
| $n_i$ | 29018 | 2903 | 291 | 98 | 59 |
| $\tau_i$ (ms) | 58.036 | 5.806 | 0.582 | 0.196 | 0.118 |
| $f_1$ = 500 KHz | | | | | |

TABLE 1-continued

| | | | | | |
|---|---|---|---|---|---|
| $\tau_i$ (ms) $f_1$ = 1 MHz | 29.018 | 2.903 | 0.291 | 0.098 | 0.059 |
| $\tau_i$ (ms) $f_1$ = 2 MHz | 14.509 | 1.451 | 0.145 | 0.049 | 0.029 |

In order to avoid damage to patterned structure on wafer, a stable cavitation must be maintained, and the bubble implosion or micro jet must be avoided. FIGS. 7A to 7C shows a method to achieve a damage free ultra or mega-sonic cleaning on a wafer with patterned structure by maintaining a stable bubble cavitation according to the present invention. FIG. 7A shows waveform of power supply outputs, and FIG. 7B shows the temperature curve corresponding to each cycle of cavitation, and FIG. 7C shows the bubble size expansion during each cycle of cavitation. Operation process steps to avoid bubble implosion according to the present invention are disclosed as follows:

Step 1: Put ultra/mega sonic device adjacent to surface of wafer or substrate set on a chuck or tank;

Step 2: Fill chemical liquid or gas (hydrogen, nitrogen, oxygen, or $CO_2$) doped water between wafer and the ultra/mega sonic device;

Step 3: Rotate chuck or oscillate wafer;

Step 4: Set power supply at frequency $f_1$ and power $P_1$;

Step 5: Before temperature of gas and vapor inside bubble reaches implosion temperature $T_i$, (or time reach $\tau_1 < \tau_i$ as being calculated by equation (11)), set power supply output to zero watts, therefore the temperature of gas inside bubble start to cool down since the temperature of liquid or water is much lower than gas temperature.

Step 6: After temperature of gas inside bubble decreases to room temperature $T_0$ or time (zero power time) reaches $\tau_2$, set power supply at frequency $f_1$ and power $P_1$ again.

Step 7: repeat Step 1 to Step 6 until wafer is cleaned.

In step 5, the time $\tau_1$ must be shorter than $\tau_i$ in order to avoid bubble implosion, and $\tau_i$ can be calculated by using equation (11).

In step 6, the temperature of gas inside bubble is not necessary to be cooled down to room temperature or liquid temperature; it can be certain temperature above room temperature or liquid temperature, but better to be significantly lower than implosion temperature $T_i$.

According to equations 8 and 9, if ($\Delta T-\delta T$) can be known, the $\tau_i$ can be calculated. But in general, ($\Delta T-\delta T$) is not easy to be calculated or measured directly. The following method can determine the implosion time $\tau_i$ experimentally.

Step 1: Based on Table 1, choosing 5 different time $\tau_1$ as design of experiment (DOE) conditions, Step 2: choose time $\tau_2$ at least 10 times of $\tau_1$, better to be 100 times of $\tau_1$ at the first screen test Step 3: fix certain power $P_0$ to run above five conditions cleaning on specific patterned structure wafer separately. Here, $P_0$ is the power at which the patterned structures on wafer will be surely damaged when running on continuous mode (non-pulse mode).

Step 4: Inspect the damage status of above five wafers by SEMS or wafer pattern damage review tool such as AMAT SEM vision or Hitachi IS3000, and then the implosion time $\tau_i$ can be located in certain range.

Step 1 to 4 can be repeated again to narrow down the range of implosion time $\tau_i$. After knowing the implosion time $\tau_i$, the time $\tau_1$ can be set at a value smaller than $0.5\tau_i$ for safety margin. One example of experimental data is described as following.

The patterned structures are 55 nm poly-silicon gate lines. Ultra/mega sonic wave frequency was 1 MHz, and ultra/mega-sonic device manufactured by Prosys was used and operated in a gap oscillation mode (disclosed by PCT/CN2008/073471) for achieving better uniform energy dose within wafer and wafer to wafer. Other experimental parameters and final pattern damage data are summarized in Table 2 as follows:

TABLE 2

| Wafer ID | $CO_2$ conc. (18 μs/cm) | Process Time (sec) | Power Density (Watts/cm2) | Cycle Number | $\tau_1$ (ms) | $\tau_2$ (ms) | Number of Damage Sites |
|---|---|---|---|---|---|---|---|
| #1 | 18 | 60 | 0.1 | 2000 | 2 | 18 | 1216 |
| #2 | 18 | 60 | 0.1 | 100 | 0.1 | 0.9 | 0 |

It was clear that the $\tau_1$=2 ms (or 2000 cycle number) introduced as many as 1216 damage sites to patterned structure with 55 nm feature size, but that the $\tau_1$=0.1 ms (or 100 cycle number) introduced zero (0) damage sites to patterned structure with 55 nm feature size. So that the $\tau_i$ is some number between 0.1 ms and 2 ms, more detail tests need to be done to narrow its range. Obviously, the cycle number related to ultra or mega sonic power density and frequency, the larger the power density, the less the cycle number; and the lower the frequency, the less the cycle number. From above experimental results, we can predict that the damage-free cycle number should be smaller than 2,000, assuming the power density of ultra or mega sonic wave is larger than 0.1 watts or $cm^2$, and frequency of ultra or mega sonic wave is equal to or less than 1 MHz. If the frequency increases to a range larger than 1 MHz or power density is less than than 0.1 watts/$cm^2$, it can be predicted that the cycle number will increase.

After knowing the time $\tau_1$, then the time $\tau_2$ can be shorten based on similar DEO method described above, i.e. fix time $\tau_1$, gradually shorten the time $\tau_2$ to run DOE till damage on patterned structure being observed. As the time $\tau_2$ is shorten, the temperature of gas and or vapor inside bubbler cannot be cooled down enough, which will gradually shift average temperature of gas and vapor inside bubbler up, eventually it will trigger implosion of bubble. This trigger time is called critical cooling time. After knowing critical cooling time $\tau_c$, the time $\tau_2$ can be set at value larger than $2\tau_c$ for the same reason to gain safety margin.

Figure 8A:
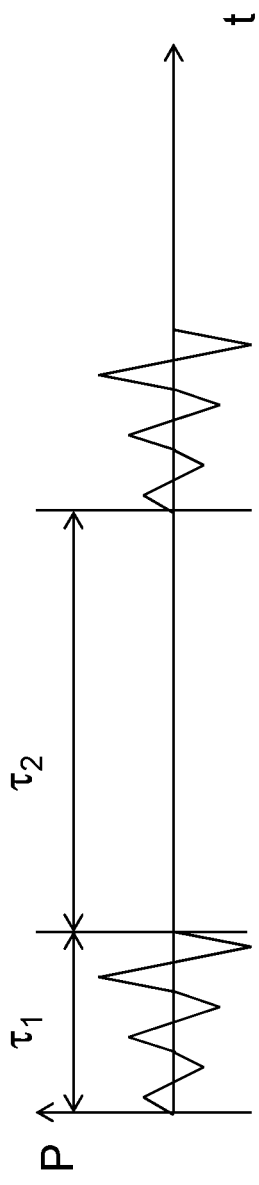
FIGS. 8A-8D depict another exemplary wafer cleaning method.
Figure 8B:
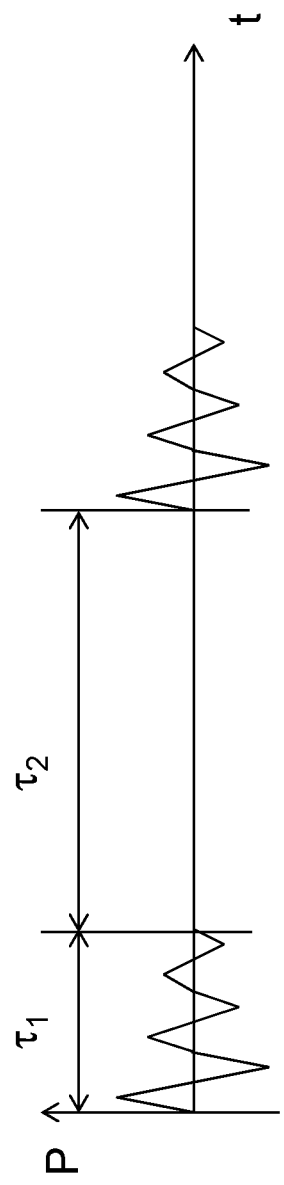
Figure 8C:
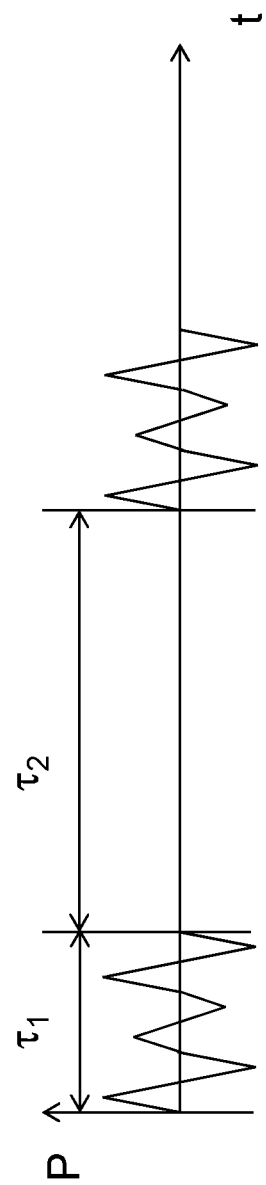
Figure 8D:
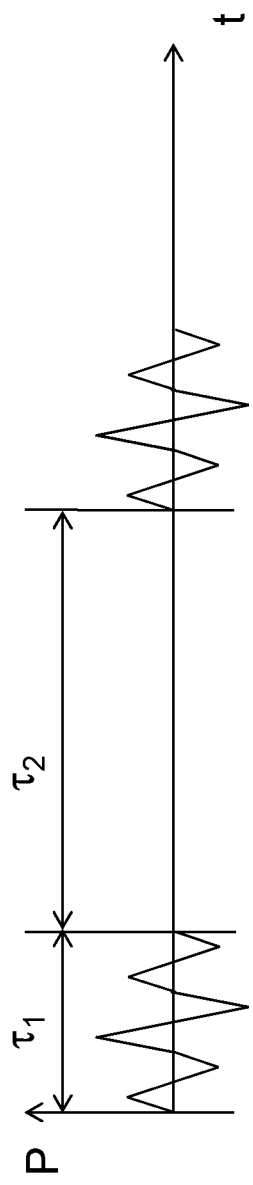

FIGS. 8A to 8D show another embodiment of wafer cleaning method using a ultra/mega sonic device according to the present invention. The method is similar to that shown in FIG. 7A, except in step 4 setting ultra/mega sonic power supply at frequency $f_1$ and power with changing amplitude of waveform. FIG. 8A shows another cleaning method of setting ultra/mega sonic power at frequency $f_1$ and power with increasing amplitude of waveform in step 4. FIG. 8B shows another cleaning method of setting ultra/mega sonic power supply at frequency $f_1$ and power with decreasing amplitude of waveform in step 4. FIG. 8C shows another cleaning method of setting ultra/mega sonic power supply at frequency $f_1$ and power with decreasing first and increasing later amplitude of waveform in step 4. FIG. 8D shows further another cleaning method of setting ultra/mega sonic power at frequency $f_1$ and power with increasing first and decreasing later amplitude of waveform in step 4.

FIGS. 9A to 9D show another embodiment of wafer cleaning method using a ultra/mega sonic device according to the present invention. The method is similar to that shown in FIG. 7A, except in step 4 setting ultra/mega sonic power supply at changing frequency. FIG. 9A shows another cleaning method of setting ultra/mega sonic power supply at frequency $f_1$ first then frequency $f_3$ later, $f_1$ is higher than $f_3$ in step 4. FIG. 9B shows another cleaning method of setting ultra/mega sonic power supply at frequency $f_3$ first then frequency $f_1$ later, $f_1$ is higher than $f_3$ in step 4. FIG. 9C shows another cleaning method of setting ultra/mega sonic power supply at frequency $f_3$ first, frequency $f_1$ later and $f_3$ last, $f_1$ is higher than $f_3$ in step 4. FIG. 9D shows another cleaning method of setting ultra/mega sonic power supply at frequency $f_1$ first, frequency $f_3$ later and $f_1$ last, $f_1$ is higher than $f_3$ in step 4.

Similar to method shown in FIG. 9C, the ultra/mega sonic power can be set at frequency $f_1$ first, at frequency $f_3$ later and at frequency $f_4$ at last in step 4, where $f_4$ is smaller than $f_3$, and $f_3$ is smaller than $f_1$.

Again similar to method shown in FIG. 9C, the ultra/mega sonic power can be set at frequency $f_4$ first, at frequency $f_3$ later and at frequency $f_1$ at last in step 4, where $f_4$ is smaller than $f_3$, and $f_3$ is smaller than $f_1$.

Again similar to method shown in FIG. 9C, the ultra/mega sonic power can be set at frequency $f_1$ first, at frequency $f_4$ later and at frequency $f_3$ at last in step 4, where $f_4$ is smaller than $f_3$, and $f_3$ is smaller than $f_1$.

Again similar to method shown in FIG. 9C, the ultra/mega sonic power can be set at frequency $f_3$ first, at frequency $f_4$ later and at frequency $f_1$ at last in step 4, where $f_4$ is smaller than $f_3$, and $f_3$ is smaller than $f_1$.

Again similar to method shown in FIG. 9C, the ultra/mega sonic power can be set at frequency $f_3$ first, at frequency $f_1$ later and at frequency $f_4$ at last in step 4, where $f_4$ is smaller than $f_3$, and $f_3$ is smaller than $f_1$.

Again similar to method shown in FIG. 9C, the ultra/mega sonic power can be set at frequency $f_4$ first, at frequency $f_1$ later and at frequency $f_3$ at last in step 4, where $f_4$ is smaller than $f_3$, and $f_3$ is smaller than $f_1$.

FIGS. 10A to 10B show another method to achieve a damage free ultra/mega-sonic cleaning on a wafer with patterned structure by maintaining a stable bubble cavitation in according to the present invention. FIG. 10A shows waveform of power supply outputs, and FIG. 10B shows the temperature curve corresponding to each cycle of cavitation. Operation process steps according to the present invention are disclosed as follows:

Step 1: Put ultra/mega sonic device adjacent to surface of wafer or substrate set on a chuck or tank;

Step 2: Fill chemical liquid or gas doped water between wafer and the ultra/mega sonic device;

Step 3: Rotate chuck or oscillate wafer;

Step 4: Set power supply at frequency $f_1$ and power $P_1$;

Step 5: Before temperature of gas and vapor inside bubble reaches implosion temperature $T_i$, (total time $\tau_1$ elapes), set power supply output at frequency $f_1$ and power $P_2$, and $P_2$ is smaller than $P_1$. Therefore the temperature of gas inside bubble start to cool down since the temperature of liquid or water is much lower than gas temperature.

Step 6: After temperature of gas inside bubble decreases to certain temperature close to room temperature $T_0$ or time (zero power time) reach $\tau_2$, set power supply at frequency $f_1$ and power $P_1$ again.

Step 7: repeat Step 1 to Step 6 until wafer is cleaned.

In step 6, the temperature of gas inside bubble can not be cooled down to room temperature due to power $P_2$, there should be a temperature difference $\Delta T_2$ existing in later stage of $\tau_2$ time zone, as shown in FIG. 10B.

Figures 11A, 11B:
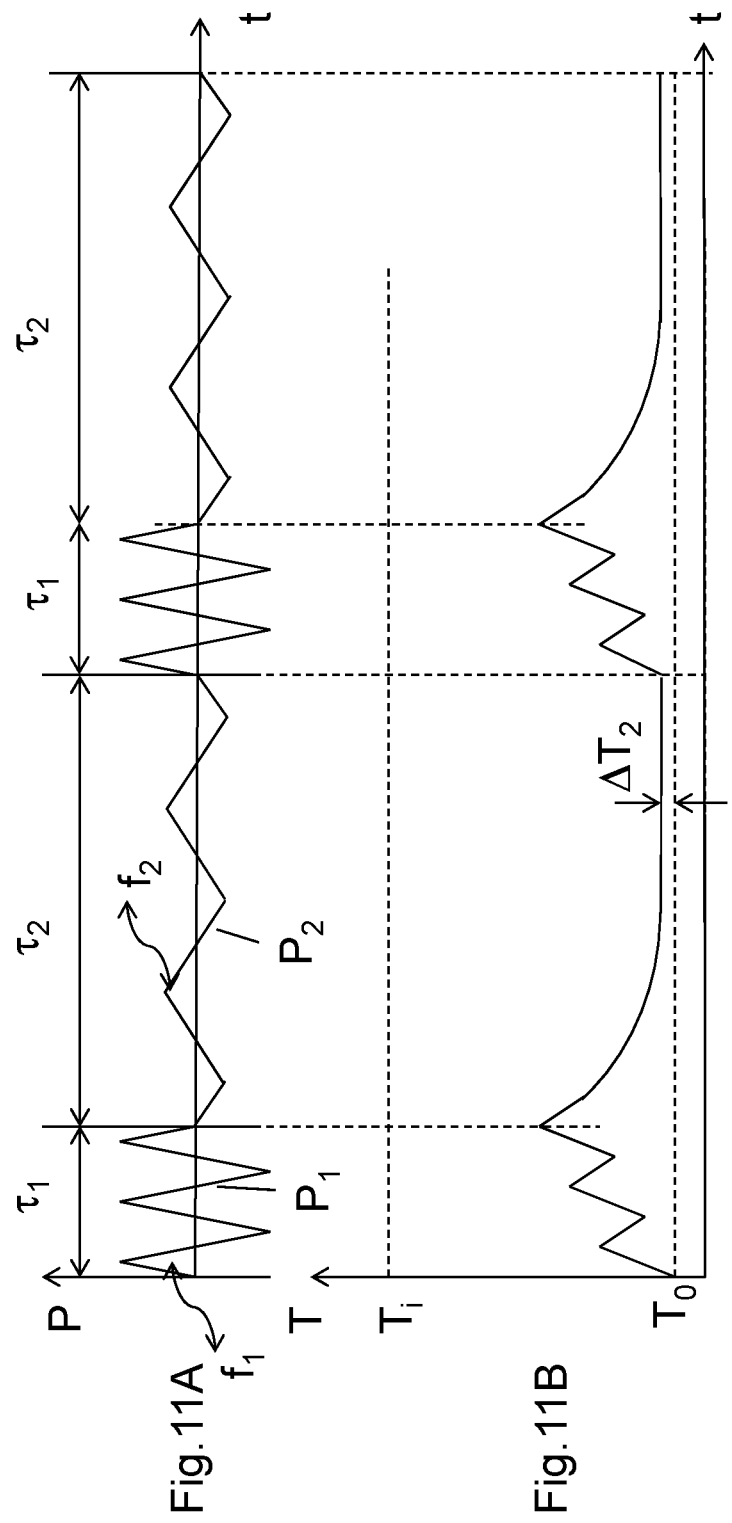
FIGS. 11A-11B depict another exemplary wafer cleaning method.

FIGS. 11A to 11B show another embodiment of wafer cleaning method using a ultra/mega sonic device according to the present invention. The method is similar to that shown in FIG. 10A, except in step 5 setting ultra/mega sonic power at frequency $f_2$ and power $P_2$, where $f_2$ is lower than $f_1$ and $P_2$ is less than $P_1$. Since $f_2$ is lower than $f_1$, the temperature of gas or vapor inside bubble increasing faster, therefore the P2 should be set significantly less than P1, better to be 5 or 10 times less in order to reduce temperature of gas and or vapor inside bubble.

FIGS. 12A to 12B show another embodiment of wafer cleaning method using a ultra/mega sonic device according to the present invention. The method is similar to that shown in FIG. 10A, except in step 5 setting ultra/mega sonic power at frequency $f_2$ and power $P_2$, where $f_2$ is higher than $f_1$, and $P_2$ is equal to $P_1$.

FIGS. 13A to 13B show another embodiment of wafer cleaning method using a ultra/mega sonic device according to the present invention. The method is similar to that shown in FIG. 10A, except in step 5 setting ultra/mega sonic power at frequency $f_2$ and power $P_2$, where $f_2$ is higher than $f_1$, and $P_2$ is less than $P_1$.

Figures 14A, 14B:
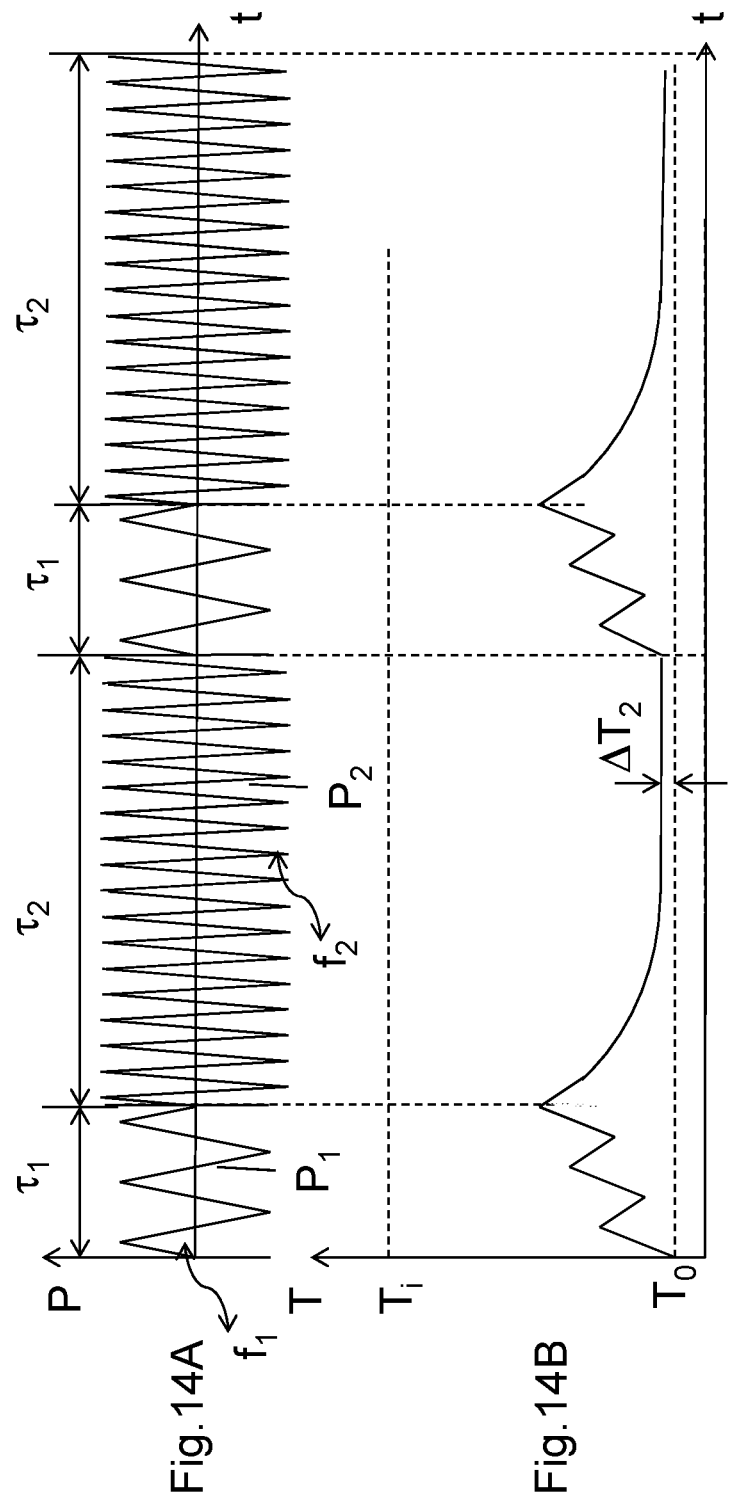
FIGS. 14A-14B depict another exemplary wafer cleaning method.
Figure 15A:
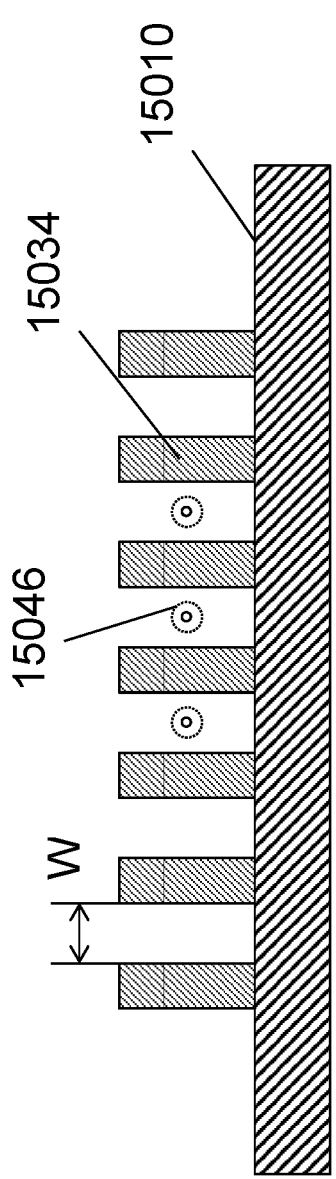
FIGS. 15A-15C depict a stable cavitation damaging patterned structure on a wafer during cleaning process.
Figure 15B:
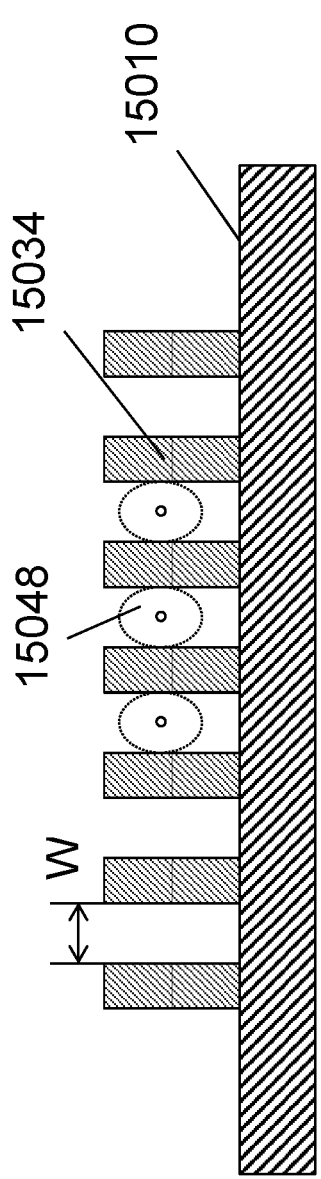
Figure 15C:
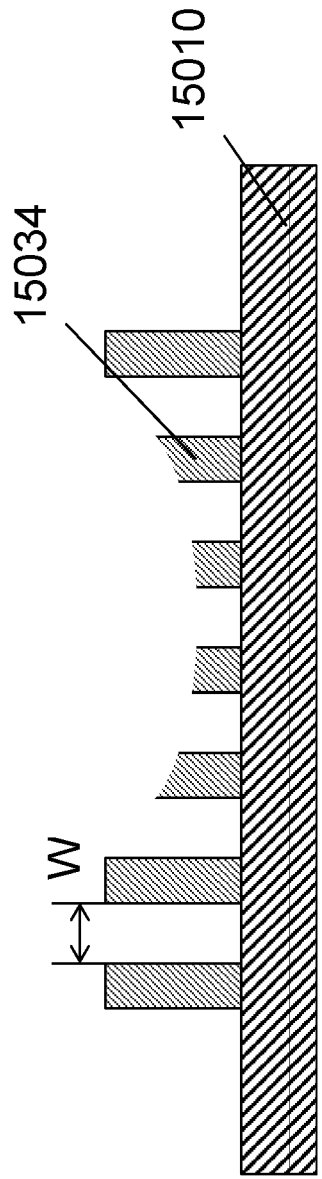

FIGS. 14A-14B shows another embodiment of wafer cleaning method using a ultra/mega sonic device according to the present invention. The method is similar to that shown in FIG. 10A, except in step 5 setting ultra/mega sonic power at frequency $f_2$ and power $P_2$, where $f_2$ is higher than $f_1$, and $P_2$ is higher than $P_1$. Since $f_2$ is higher than $f_1$, the temperature of gas or vapor inside bubble increasing slower, therefore the P2 can be slightly higher than P1, but must make sure the temperature of gas and vapor inside bubbler decreases in time zone $\tau_2$ comparing to temperature zone $\tau_1$, as shown in FIG. 14B FIGS. 4A and 4B show that patterned structure is damaged by the violent micro jet. FIGS. 15A and 15B show that the stable cavitation can also damage the patterned structure on wafer. As bubble cavitation continues, the temperature of gas and vapor inside bubble increases, therefore size of bubble 15046 also increases as shown in FIG. 15A. When size of bubble 15048 becomes larger than dimension of space W in patterned structure as shown in FIG. 15B, the expansion force of bubble cavitation can damage the patterned structure 15034 as shown in FIG. 15C. Another cleaning method according to the present invention are disclosed as follows:

Step 1: Put ultra/mega sonic device adjacent to surface of wafer or substrate set on a chuck or tank;

Step 2: Fill chemical liquid or gas doped water between wafer and the ultra/mega sonic device;

Step 3: Rotate chuck or oscillate wafer;

Step 4: Set power supply at frequency $f_1$ and power $P_1$;

Step 5: Before size of bubble reaches the same dimension of space W in patterned structures (time $\tau_1$ elapse), set power supply output to zero watts, therefore the temperature of gas inside bubble starts to cool down since the temperature of liquid or water is much lower than gas temperature;

Step 6: After temperature of gas inside bubble continues to reduce (either it reaches room temperature $T_0$ or time (zero power time) reach $\tau_2$, set power supply at frequency $f_1$ power $P_1$ again;

Step 7: repeat Step 1 to Step 6 until wafer is cleaned;

In step 6, the temperature of gas inside bubble is not necessary to be cooled down to room temperature, it can be any temperature, but better to be significantly lower than implosion temperature $T_i$. In the step 5, bubble size can be slightly larger than dimension of patterned structures as long as bubble expansion force does not break or damage the patterned structure. The time $\tau_1$ can be determined experimentally by using the following method:

Step 1: Similar to Table 1, choosing 5 different time $\tau_1$ as design of experiment (DOE) conditions, Step 2: choose time $\tau_2$ at least 10 times of $\tau_1$, better to be 100 times of $\tau_1$ at the first screen test Step 3: fix certain power $P_0$ to run above five conditions cleaning on specific patterned structure wafer separately. Here, $P_0$ is the power at which the patterned structures on wafer will be surely damaged when running on continuous mode (non-pulse mode).

Step 4: Inspect the damage status of above five wafers by SEMS or wafer pattern damage review tool such as AMAT SEM vision or Hitachi IS3000, and then the damage time $\tau_i$ can be located in certain range.

Step 1 to 4 can be repeated again to narrow down the range of damage time $\tau_d$. After knowing the damage time $\tau_d$, the time $\tau_1$ can be set at a value smaller than $0.5\,\tau_d$ for safety margin.

All cleaning methods described from FIG. 7 to FIG. 14 can be applied in or combined with the method described in FIG. 15.

Figure 16:
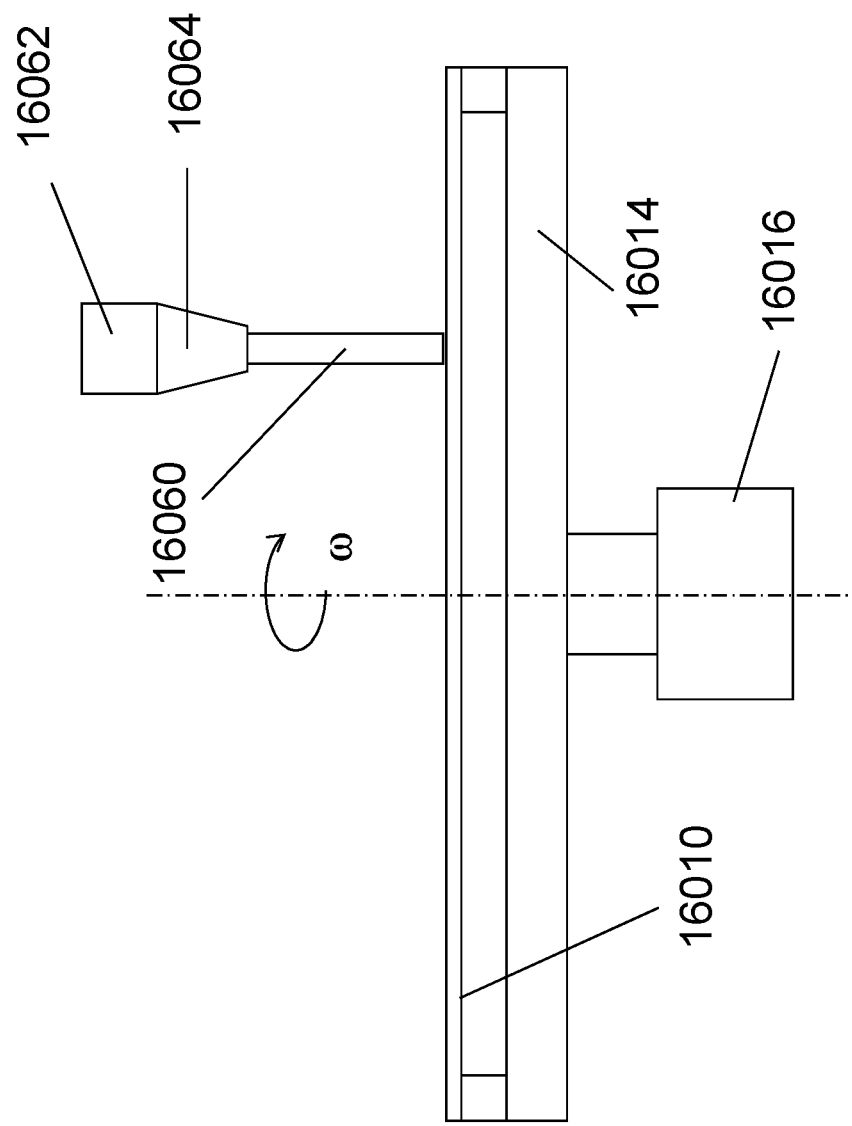
FIG. 16 depicts another exemplary wafer cleaning apparatus using ultra/mega sonic device.

FIG. 16 shows a wafer cleaning apparatus using a ultra/mega sonic device. The wafer cleaning apparatus consists of wafer 16010, wafer chuck 16014 being rotated by rotation driving mechanism 16016, nozzle 16064 delivering cleaning chemicals or de-ionized water 16060, ultra/mega sonic device 16062 coupled with nozzle 16064, and ultra/mega sonic power supply. Ultra/mega sonic wave generated by ultra/mega sonic device 16062 is transferred to wafer through chemical or water liquid column 16060. All cleaning methods described from FIG. 7 to FIG. 15 can be used in cleaning apparatus described in FIG. 16.

Figure 17:
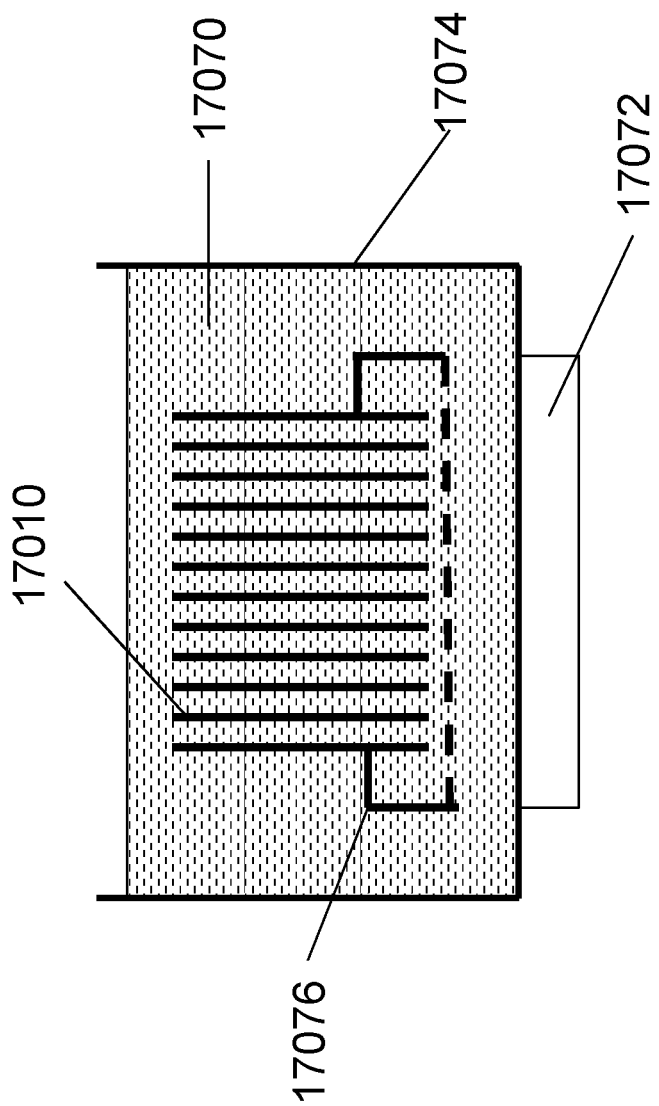
FIG. 17 depicts an exemplary wafer cleaning apparatus using ultra/mega sonic device.

FIG. 17 shows a wafer cleaning apparatus using a ultra/mega sonic device. The wafer cleaning apparatus consists of wafers 17010, a cleaning tank 17074, a wafer cassette 17076 holding the wafers 17010 and being held in the cleaning tank 17074, cleaning chemicals 17070, a ultra/mega sonic device 17072 attached to outside wall of the cleaning tank 17074, and a ultra/mega sonic power supply. At least one inlet fills the cleaning chemicals 17070 into the cleaning tank 17074 to immerse the wafers 17010. All cleaning methods described from FIG. 7 to FIG. 15 can be used in cleaning apparatus described in FIG. 17.

Figure 18A:
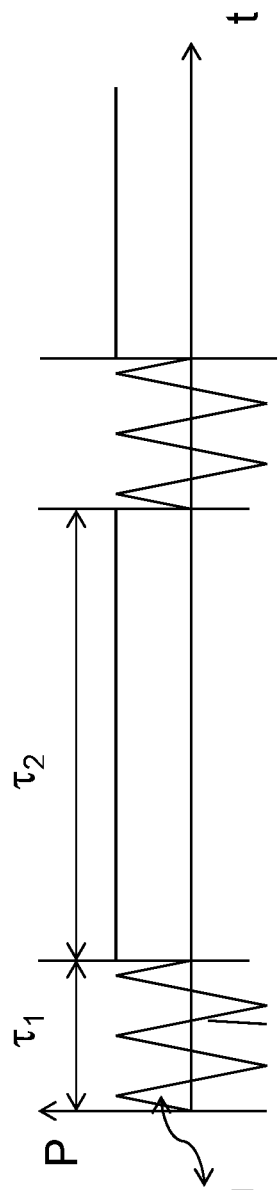
FIGS. 18A-18C depict another exemplary wafer cleaning method.
Figure 18B:
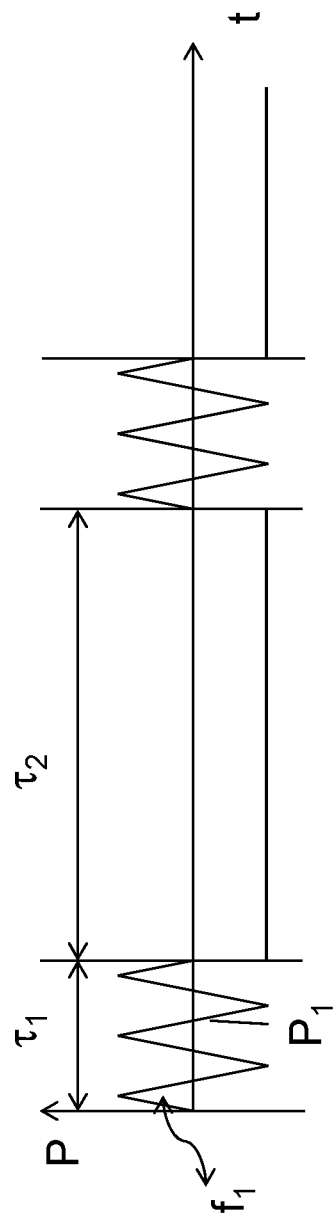
Figure 18C:
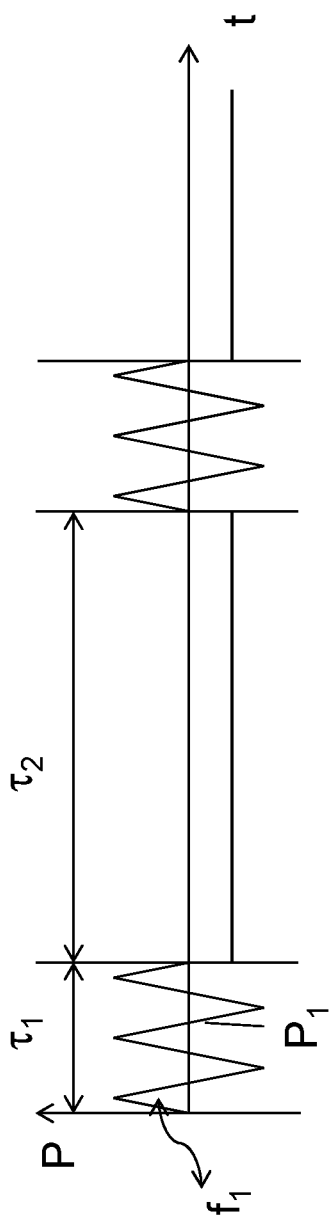

FIGS. 18A to 18C show another embodiment of wafer cleaning method using a ultra/mega sonic device according to the present invention. The method is similar to that shown in FIG. 7A, except in Step 5: Before temperature of gas and vapor inside bubble reaches implosion temperature $T_i$, (or time reach $\tau_1 < \tau_i$ as being calculated by equation (11)), set power supply output to a positive value or negative DC value to hold or stop ultra/mega sonic device to vibrate, therefore the temperature of gas inside bubble start to cool down since the temperature of liquid or water is much lower than gas temperature. The positive value of negative value can be bigger, equal to or smaller than power $P_1$.

FIG. 19 shows another embodiment of wafer cleaning method using a ultra/mega sonic device according to the present invention. The method is similar to that shown in FIG. 7A, except in Step 5: Before temperature of gas and vapor inside bubble reaches implosion temperature $T_i$, (or time reach $\tau_1 < \tau_i$ as being calculated by equation (11)), set power supply output at the frequency same as $f_1$ with reverse phase to $f_1$ to quickly stop the cavitation of bubble. Therefore the temperature of gas inside bubble start to cool down since the temperature of liquid or water is much lower than gas temperature. The positive value of negative value can be bigger, equal or less than power $P_1$. During above operation, the power supply output can be set at a frequency different from frequency $f_1$ with reverse phase to $f_1$ in order to quickly stop the cavitation of bubble.

FIGS. 20A-20D show bubble implosion occurs during the bubble cavitation generated by the ultra or mega sonic energy without damage patterned structures on the wafer. In some case, the patterned structure such as vias 20034 and trenches 20036 on the wafer 20010 has a certain mechanical strength, such as that the size of bubble cavitation generated by high frequency sonic power is controlled in a rather small dimension which is much smaller than the critical dimension of the patterned structure, therefore, these small bubble implosion force exerts a very small impact to the patterned structure with large dimension, or that the material characteristic of the patterned structure can sustain a certain intensity of mechanical force naturally. If the micro jet force generated by the bubble implosion is controlled within the intensity that the patterned structures can sustain, the patterned structures will not be damaged. In addition, the mechanical force of the micro jet generated by the bubble implosion contributes to the particles or residues removal performance inside the patterned structures of vias and or trenches or on the surface of the wafer, and it also achieves a higher cleaning efficiency. The micro jet with a controllable intensity, higher than the implosion point yet lower than the damage point, is desired in a cleaning process for a better cleaning performance and efficiency.

FIGS. 21A-21B show that during the sonic power $P_1$ working on the bubbles at the time of $\tau_1$, the bubble implosion starts to occur when the temperature of first bubble reaching to its implosion temperature at the point of $T_i$, and then some bubble implosion continues to occur during the temperature increasing from $T_i$ to $T_n$ (during the time of $\Delta\tau$), and then turning the sonic power off in the time interval of $\tau_2$, the temperature of the bubble cooling down from $T_n$ to original $T_0$ by the surrounding liquid. $T_i$ is determined as a threshold of the temperature for general bubble implosion in the features of vias and trenches, which triggers the first bubble implosion.

Since thermal transfer is not exactly uninform in the features, more and more bubble implosion will keep occurring after the temperature reaching to $T_i$. The bubble implosion intensity will become higher and higher while the implosion temperature T increasing. However, the bubble implosion is controlled under the implosion intensity that would result in the patterned structures damage by controlling the temperature $T_n$ below the temperature $T_d$ (controlling time of $\Delta\tau$), wherein $T_n$ is the bubbles maximum temperature obtained by sonic power keeping working on the bubbles after the cycles of n, and $T_d$ is the temperature of the accumulation of certain amount bubbles implosion with a high intensity (or power) to result in the patterned structure damage. In a cleaning process, the control of bubble implosion intensity is achieved by the control of the time $\Delta\tau$ after the first bubble implosion start, so as to achieve a desired cleaning performance and efficiency, and prevent the intensity too high to cause the patterned structure damage.

FIGS. 21A-21B show another embodiment of wafer cleaning method using an ultra/mega sonic device according to the present invention. In order to increase particle removal efficiency (PRE), it is desired to have a controlled transit cavitation in the mega-sonic cleaning process. The controlled transit cavitation is reached by setting a sonic power supply with power $P_1$ at a time interval shorter than $\tau_1$, and setting the sonic power supply with power $P_2$ at a time interval longer than $\tau_2$, and repeating above steps till the wafer is cleaned, where power $P_2$ is equal to zero or much smaller than power $P_1$, $\tau_1$ is a time interval that the temperature inside bubble raises higher than a critical implosion temperature; and $\tau_2$ is a time interval that the temperature inside bubble falls down to a temperature much lower than the critical implosion temperature. Since the controlled transit cavitation will have certain bubble implosion in the cleaning process, therefore the controlled transit cavitation will provide the higher PRE (particle removal efficiency) with minimized damage to patterned structures. The critical implosion temperature is the lowest temperature inside bubble, which will cause the first bubble implosion. In order to further increase PRE, it is needed to further increase temperature of the bubbles, therefore a longer time $\tau_1$ is needed. Also the temperature of bubble can be increased by shorting the time of $\tau_2$. The frequency of ultra or mega sonic is another parameter to control the level of implosion. Normally, the higher the frequency is, the lower level or intensity of the implosion is.

Another embodiment of wafer cleaning method using an ultra/mega sonic device to achieve a damage free ultra/mega sonic cleaning on a wafer with patterned structure by maintaining controlled transit cavitation is provided according to the present invention. The controlled transit cavitation is controlled by setting a sonic power supply with frequency $f_1$ at a time interval shorter than $\tau_1$, and setting the sonic power supply with frequency $f_2$ at a time interval longer than $\tau_2$, and repeating above steps till the wafer is cleaned, where $f_2$ is much higher than $f_1$, better to be 2 times or 4 times higher, $\tau_1$ is a time interval that the temperature inside bubble raises higher than a critical implosion temperature; and $\tau_2$ is a time interval that the temperature inside bubble falls down to a temperature much lower than the critical implosion temperature. The controlled transit cavitation will provide the higher PRE (particle removal efficiency) with minimized damage to patterned structures. The critical implosion temperature is the lowest temperature inside bubble, which will cause the first bubble implosion. In order to further increase PRE, it is needed to further increase temperature of the bubbles, therefore a longer time $\tau_1$ is needed. Also the temperature of bubble can be increased by shorting the time of $\tau_2$. The frequency of ultra or mega sonic is another parameter to control the level of implosion. Normally, the higher the frequency is, the lower level or intensity of the implosion is.

As described above, the present invention provides a method for cleaning substrate without damaging patterned structure on the substrate using ultra/mega sonic device. The method comprises: applying liquid into a space between a substrate and an ultra/mega sonic device; setting an ultra/mega sonic power supply at frequency $f_1$ and power $P_1$ to drive said ultra/mega sonic device; after micro jet generated by bubble implosion and before said micro jet generated by bubble implosion damaging patterned structure on the substrate, setting said ultra/mega sonic power supply at frequency $f_2$ and power $P_2$ to drive said ultra/mega sonic device; after temperature inside bubble cooling down to a set temperature, setting said ultra/mega sonic power supply at frequency $f_1$ and power $P_1$ again; repeating above steps till the substrate being cleaned.

In an embodiment, the present invention provides an apparatus for cleaning substrate using ultra/mega sonic device. The apparatus includes a chuck, an ultra/mega sonic device, at least one nozzle, an ultra/mega sonic power supply and a controller. The chuck holds a substrate. The ultra/mega sonic device is positioned adjacent to the substrate. The at least one nozzle injects chemical liquid on the substrate and a gap between the substrate and the ultra/mega sonic device. The controller sets the ultra/mega sonic power supply at frequency $f_1$ and power $P_1$ to drive said ultra/mega sonic device; after micro jet generated by bubble implosion and before said micro jet generated by bubble implosion damaging patterned structure on the substrate, setting the ultra/mega sonic power supply at frequency $f_2$ and power $P_2$ to drive said ultra/mega sonic device; after temperature inside bubble cooling down to a set temperature, setting the ultra/mega sonic power supply at frequency $f_1$ and power $P_1$ again; repeating above steps till the substrate being cleaned.

In another embodiment, the present invention provides an apparatus for cleaning substrate using ultra/mega sonic device. The apparatus includes a cassette, a tank, an ultra/mega sonic device, at least one inlet, an ultra/mega sonic power supply and a controller. The cassette holds at least one substrate. The tank holds said cassette. The ultra/mega sonic device is attached to outside wall of said tank. The at least one inlet is used for filling chemical liquid into said tank to immerse said substrate. The controller sets the ultra/mega sonic power supply at frequency $f_1$ and power $P_1$ to drive said ultra/mega sonic device; after micro jet generated by bubble implosion and before said micro jet generated by bubble implosion damaging patterned structure on the substrate, setting said ultra/mega sonic power supply at frequency $f_2$ and power $P_2$ to drive said ultra/mega sonic device; after temperature inside bubble cooling down to a set temperature, setting said ultra/mega sonic power supply at frequency $f_1$ and power $P_1$ again; repeating above steps till the substrate being cleaned.

In another embodiment, the present invention provides an apparatus for cleaning substrate using ultra/mega sonic device. The apparatus includes a chuck, an ultra/mega sonic device, a nozzle, an ultra/mega sonic power supply and a controller. The chuck holds a substrate. The ultra/mega sonic device coupled with the nozzle is positioned adjacent to the substrate. The nozzle injects chemical liquid on the substrate. The controller sets the ultra/mega sonic power supply at frequency $f_1$ and power $P_1$ to drive said ultra/mega sonic device; after micro jet generated by bubble implosion and before said micro jet generated by bubble implosion damaging patterned structure on the substrate, setting said ultra/mega sonic power supply at frequency $f_2$ and power $P_2$ to drive said ultra/mega sonic device; after temperature inside bubble cooling down to a set temperature, setting said ultra/mega sonic power supply at frequency $f_1$ and power $P_1$ again; repeating above steps till the substrate being cleaned.

The embodiments disclosed from FIG. 8 to FIG. 19 can be applied in embodiments disclosed in FIG. 21.

Generally speaking, an ultra/mega sonic wave with the frequency between 0.1 MHz~10 MHz may be applied to the method disclosed in the present invention.

Although the present invention has been described with respect to certain embodiments, examples, and applications, it will be apparent to those skilled in the art that various modifications and changes may be made without departing from the invention.

What is claimed is:

1. A method for cleaning a semiconductor wafer comprising features of patterned structures, the method comprising:
   applying liquid on the semiconductor wafer;
   controlling, based on a timer, a power supply of a transducer to deliver acoustic energy to the liquid at a first frequency and a first power level for at least a portion of a predetermined first time period, wherein bubble implosion occurs in the first time period; and controlling, based on the timer, the power supply of the transducer to deliver acoustic energy to the liquid at a second frequency and a second power level for at least a portion of a predetermined second time period, wherein the first and second time periods are alternately applied one after another for a predetermined number of cycles, wherein the first and second time periods, the first and second power levels, and the first and second frequencies are determined such that no feature is damaged as a result of delivering the acoustic energy; and wherein the bubble implosion is controlled under an implosion intensity that would result in damages to the patterned structures by controlling Tn below Td, wherein Tn is a maximum temperature of the bubbles after the predetermined number of cycles, and Td is a temperature of the bubbles that would result in implosion with a high intensity damaging the patterned structures.

2. The method of claim 1, wherein the second power level is lower than the first power level.

3. The method of claim 2, wherein the second power level is zero.

4. The method of claim 1, wherein the second frequency is higher than the first frequency.

5. The method of claim 1, wherein acoustic energy in the second time period is in antiphase to acoustic energy in the first time period.

6. The method of claim 1, wherein the first frequency is equal to the second frequency, while the first power level is higher than the second power level.

7. The method of claim 1, wherein the first frequency is higher than the second frequency, while the first power level is higher than the second power level.

8. The method of claim 1, wherein the first frequency is lower than the second frequency, while the first power level is equal to the second power level.

9. The method of claim 1, wherein the first frequency is lower than the second frequency, while the first power level is higher than the second power level.

10. The method of claim 1, wherein the first frequency is lower than the second frequency, while the first power lever is lower than the second power level.

11. The method of claim 1, wherein the acoustic energy power level rises from the first power level during the first time period.

12. The method of claim 1, wherein the acoustic energy power level falls from the first power level during the first time period.

13. The method of claim 1, wherein the acoustic energy power level both rises and falls from the first power level during the first time period.

14. The method of claim 1, wherein the acoustic energy frequency changes to a lower value from the first frequency during the first time period.

15. The method of claim 1, wherein the acoustic energy frequency changes to a higher value from the first frequency during the first time period.

16. The method of claim 1, wherein the acoustic energy frequency changes to a higher value from the first frequency and then back to the first frequency during the first time period.

17. The method of claim 1, wherein the acoustic energy frequency changes to a lower value from the first frequency and then back to the first frequency during the first time period.

18. The method of claim 1, wherein the acoustic energy frequency changes from the first frequency to a first lower value lower than the first frequency, and then to a second lower value lower than the first lower value, during the first time period.

19. The method of claim 1, wherein the acoustic energy frequency changes from the first frequency to a first higher value higher than the first frequency, and then to a second higher value higher than the first higher value, during the first time period.

20. The method of claim 1, wherein the acoustic energy frequency changes from the first frequency to a first lower value lower than the first frequency, and then to a second lower value higher than the first lower value but lower than the first frequency, during the first time period.

21. The method of claim 1, wherein the acoustic energy frequency changes from the first frequency to a lower value lower than the first frequency, and then to a higher value higher than the first frequency, during the first time period.

22. The method of claim 1, wherein the acoustic energy frequency changes from the first frequency to a higher value higher than the first frequency, and then to a lower value lower than the first frequency, during the first time period.

23. The method of claim 1, wherein the acoustic energy frequency changes from the first frequency to a first higher value higher than the first frequency, and then to a second higher value higher than the first frequency but lower than the first higher value, during the first time period.

24. The method of claim 1, wherein the second frequency is zero and the second power level remains a constant positive value during the second time period.

25. The method of claim 1, wherein the second frequency is zero and the second power level remains a constant negative value during the second time period.

26. The method of claim 1, wherein the features comprise vias or trenches having depth to width ratios of at least 3.

27. The method of claim 1, wherein a device manufacturing node of the semiconductor wafer is no more than 16 nanometers.

28. The method of claim 1, further comprising rotating the wafer with respect to the transducer as acoustic energy is delivered.

29. The method of claim 1, wherein the features are not damaged by expansion of bubbles in the first time period.

30. The method of claim 1, wherein temperatures inside bubbles decrease in the second time period.

31. The method of claim 30, wherein temperatures inside the bubble decrease to near a temperature of said liquid in the second time period.

32. The method of claim 1, wherein the first time period is shorter than 2,000 times of a cycle period of the first frequency.

33. The method of claim 1, wherein the first time period is shorter than $((T_i-T_0-\Delta T)/(\Delta T-\delta T)+1)/f_1$, where $T_i$ is an implosion temperature, $T_0$ is a temperature of the liquid, $\Delta T$ is a temperature increase after one time of compression, $\Delta T$ is a temperature decrease after one time of expansion, and $f_1$ is the first frequency.

* * * * *